(12) United States Patent
Yamahata

(10) Patent No.: US 6,755,603 B2
(45) Date of Patent: Jun. 29, 2004

(54) APPARATUS FOR AND METHOD OF TRANSPORTING SUBSTRATES TO BE PROCESSED

(75) Inventor: Hiroshi Yamahata, Dazaifu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/992,431

(22) Filed: Nov. 21, 2001

(65) Prior Publication Data

US 2002/0037207 A1 Mar. 28, 2002

Related U.S. Application Data

(62) Division of application No. 09/251,100, filed on Feb. 16, 1999, now Pat. No. 6,368,040.

(30) Foreign Application Priority Data

Feb. 18, 1998 (JP) .............................................. 98-52845
Feb. 18, 1998 (JP) .............................................. 98-52846

(51) Int. Cl.$^7$ ................................................ B65H 1/00
(52) U.S. Cl. .................. 414/222; 414/225.01; 414/404; 414/816; 414/936; 414/937
(58) Field of Search .......................... 414/222, 225.01, 414/404, 816, 936, 937, 940, 416, 417, 935, 938

(56) References Cited

U.S. PATENT DOCUMENTS

| | | | |
|---|---|---|---|
| 5,206,627 A | 4/1993 | Kato | |
| 5,507,614 A | 4/1996 | Leonov et al. | |
| 5,976,198 A | 11/1999 | Suhara et al. | |
| 6,012,192 A | 1/2000 | Sawada et al. | |
| 6,074,515 A | 6/2000 | Iseki et al. | |
| 6,368,040 B1 | * 4/2002 | Yamasaki et al. | ...... 414/225.01 |

FOREIGN PATENT DOCUMENTS

| | | |
|---|---|---|
| DE | 4424208 | 1/1996 |
| DE | 19726305 | 1/1996 |
| DE | 19542646 | 10/1996 |
| DE | 19816199 | 2/1999 |
| JP | 5-190643 | 7/1993 |
| JP | 06-163500 | 6/1994 |
| JP | 6-163670 | 6/1994 |
| JP | 06-163670 | 6/1994 |
| JP | 9-116571 | 5/1997 |
| JP | 9-323783 | 12/1997 |
| JP | 10-41369 | 2/1998 |
| JP | 10-2760530 | 10/1998 |

* cited by examiner

Primary Examiner—Joseph A. Fischetti
(74) Attorney, Agent, or Firm—Morrison & Foerster LLP

(57) ABSTRACT

A substrate transporting apparatus includes a wafer transfer arm 10 for carrying a plurality of semiconductor wafers W being processed horizontally, a pitch changer 20 for carrying the wafers W at predetermined intervals vertically and a posture changing device 30 positioned between the wafer transfer arm 10 and the pitch changer 20, for changing the posture of the wafers W to the horizontal and vertical arrangements. The pitch changer 20 includes a first holding part 21A and a second holding part 21B which are adapted so as to elevate relatively to each other. The wafers W are held by either one of the holding parts 21A, 21B at the predetermined intervals. The posture changing device 30 has a pair of holders 31 between which the semiconductor wafers W is interposed. The holders 31 are respectively provided, on their sides opposing each other, with a plurality of holding grooves 32A, 32B for retaining the wafers W independently. With the arrangement, the whole apparatus can be small-sized to improve throughput and yield of products.

4 Claims, 18 Drawing Sheets

180° ROTATION ABOUT Z AXIS

APPARATUS FOR AND METHOD OF TRANSPORTING SUBSTRATES TO BE PROCESSED

This application is a division of application Ser. No. 09/251,100, filed on Feb. 16, 1999 now U.S. Pat. No. 6,368,040 issued on Apr. 9, 2002.

BACKGROUND OF THE INVENTION

1. Technical Field of the Invention

The present invention relates to a transporting apparatus and a transporting method, by which substrates to be processed, such as semiconductor wafers and glass substrates for a LCD (liquid crystal display) unit etc., are successively conveyed for an appropriate process.

2. Description of the Related Art

Generally, in a manufacturing process for producing semiconductor devices, there is widely adopted a substrate processing apparatus which successively transports the substrates to be processed, such as semiconductor wafers and LCD glass substrates etc.(referred to "substrates" hereinafter), to a cleaning bath filled up with the chemicals, the rinsing liquids etc. or a drying section.

In order to allow the above substrate processing apparatus to clean a plurality (e.g. 50 pcs.) of wafers or the like effectively, it has been that in the arrangement where a wafer delivery section is provided between a loading and unloading section and a processing section for the wafers etc., a method of transporting the plural wafers, which are vertically arranged at predetermined intervals, by a wafer delivering unit arranged in the wafer delivery section, consequently loading the wafers into respective processing units and also unloading the wafers from the processing units by the wafer delivering unit is preferable.

Now, the substrate processing apparatus of this kind has a problem that when the unprocessed and processed wafers are carried by the identical delivering unit, then contaminants, such as particles, which have been sticking to the unprocessed wafers, are transferred to the processed wafers through the intermediary of a wafer holding part of the wafer delivery unit, so that the processed wafers are subjected to contamination unfortunately. In order to solve this problem, it is thought that two different wafer delivering units take charges of carrying the unprocessed wafers and carrying the processed wafers, respectively. However, such a provision of two delivering units would cause the apparatus to be large-sized.

In order to solve the above problem, there is known a substrate processing apparatus where the wafer holding part of the wafer delivering unit is constituted by a first holding part consisting of two holding members for respectively holding the wafers etc. vertically and a second holding part of three holding members and additionally, the first and second holding parts are adapted so as to elevate relatively to each other, whereby the wafers etc. can be held by the raised one of the first and second holding parts. (see Japanese Unexamined Patent Publication No. 6-163670).

In the above-mentioned apparatus, however, there are two different situations to hold the unprocessed wafers etc. and hold the processed wafers etc. since the first holding part does carry each wafer at two inner points of both sides of the wafer, while the second holding part carries each wafer at three points consisting of the bottom center and both sides of the wafer. Thus, two different holding situations in the identical wafer delivering unit causes the stability in holding the wafers to be influenced. Especially, at the first holding part to hold each wafer at two inner points of both sides of the wafer, there exists a problem to produce particles because of "shaky" wafers and mutual contacts of wafers in transportation, thereby causing the reduction of product yield. Although it is thought to expand each width of the holding members in order to solve the problem, it also means to increase the contact area with the wafers, thereby increasing the possibility of producing the particles.

Now, it should be noted that, with the finer and large-scale integration and high-productivity required for the semiconductor devices in recent years, the wafers are showing a tendency to increase the diameter, for example, from 8 inches wafer to 12 inches wafer.

Under such a situation, since the size and weight of the wafer are also increased, the wafers have to be horizontally accommodated in the carrier in loading to or unloading them from the processing units, while such a horizontal arrangement has to be changed into the vertical arrangement in processing them in the processing units. However, if the posture of the wafer is changed from the horizontal arrangement to the vertical arrangement together with the carrier, there arise problems that the positional shifting of the wafers is caused and the particles are produced in transportation, so that the product yield is lowered.

Accordingly, we, inventors have developed a substrate transporting apparatus in which the horizontal arrangement of the wafers is changed to the vertical arrangement before processing the wafers, while the vertical arrangement of the wafers is changed to the horizontal arrangement after processing the wafers, as a result of our diligent investigation. (see Japanese Patent Application No. 9-116571) According to the developed substrate transporting apparatus, it is possible to process the substrates after changing the posture of substrates horizontally accommodated in a container into the vertical arrangement and also accommodate the substrates into the container after changing the posture of processed substrates to the horizontal arrangement.

Nevertheless, when changing the posture of the unprocessed and processed wafers by identical posture changing means, there still remains the problem that the particles sticking in carrying the unprocessed wafers stick to the processed wafers again, so that the wafers are contaminated together with the reduction in product yield. Therefore, it has been necessary to provide the posture changing means for the unprocessed wafers on the input side and the posture changing means for the processed wafers on the output side, respectively.

Also in this case, however, such a provision of two posture changing means would cause the apparatus to be large-sized. Furthermore, since conveyer means and the respective processing units are further large-sized with the abovementioned tendency to increase the diameter of wafers, the problem of reducing the throughput of the apparatus arises.

SUMMARY OF THE INVENTION

Accordingly, it is therefore an object of the present invention to provide a substrate transporting apparatus which is small-sized to improve the throughput and capable of carrying the unprocessed substrates and the processed substrates under the same holding condition thereby to hold the substrates stably and improve the product yield.

It is an additional object of the present invention to provide a substrate transporting method by which the substrate transporting apparatus can be small-sized thereby to improve the throughput and the product yield.

As a first feature of the present invention, the above-mentioned objects described above can be accomplished by a substrate transporting apparatus comprising:

a substrate loading and unloading section for loading and unloading a plurality of substrates;

a substrate processing section for applying a designated treatment on the substrates;

a substrate delivery section for delivering the substrates from the substrate loading and unloading section to the substrate processing section and vice versa, the substrate delivery section having substrate holding means for holding the substrates delivered in a row;

substrate transporting means for transporting the substrates between the substrate processing section and the substrate delivery section; and substrate spacing means for vertically holding the substrates lined up at predetermined intervals, the substrate spacing means being positioned between the substrate holding means and the substrate transporting means, wherein the substrate spacing means includes a first holding part for holding the substrates and a second holding part for holding the substrates;

the first holding part has a lower-part supporting member formed with a plurality of holding grooves lined up, the holding grooves respectively engaging with bottom portions of the substrates when holding the substrates vertically, and a side-part supporting member formed with a plurality of holding grooves lined up, the holding grooves respectively engaging with upper side edges on both sides of each of the bottom portions of the substrates when holding the substrates vertically;

the second holding part has a lower-part supporting member formed with a plurality of holding grooves lined up, the holding grooves respectively engaging with bottom portions of the substrates when holding the substrates vertically, and a side-part supporting member formed with a plurality of holding grooves lined up, the holding grooves respectively engaging with upper side edges on both sides of each of the bottom portions of the substrates when holding the substrates vertically; and the first and second holding parts are adapted so as to rise and fall relatively to each other, whereby the substrates are held by either one of the first holding part and the second holding part, at predetermined intervals.

The second feature of the present invention reside in that the holding grooves of the first holding part and the second holding part are formed so as to engage with the substrates at symmetrical positions thereof.

The third feature of the present invention reside in that, in common with the first holding part and the second holding part, the side-part supporting members are adapted so as to hold the substrates on one hand and the lower-part supporting members are adapted so as to prevent the substrates being held by the side-part supporting members from inclining on the other hand.

The fourth feature of the present invention reside in that, in common with the first holding part and the second holding part, the holding grooves of the side-part supporting members are formed so as to have substantial V-shaped cross sections on one hand and the holding grooves of the lower-part supporting members are formed so as to have substantial Y-shaped cross sections on the other hand.

The fifth feature of the present invention reside in that the first holding part and the second holding part are installed in two different holders, respectively and wherein at least either one of the holders is provided with elevating means for elevating the first holding part and the second holding part relatively to each other.

The sixth feature of the present invention reside in that the first holding part and the second holding part are adapted so as to change respective directions of the first and second holding parts in a horizontal plane.

The seventh feature of the present invention reside in that the substrate spacing means is adapted so as to move to both vertical and horizontal directions.

The eighth feature of the present invention reside in that a substrate transporting apparatus comprises:

horizontal holding means for horizontally holding a plurality of substrates at intervals;

vertical holding means for vertically holding the substrates at intervals; and posture changing means for changing the posture of the substrates from horizontal arrangement thereof to the vertical arrangement and vice versa, the posture changing being disposed between the horizontal holding means and the vertical holding means;

wherein the posture changing means includes a first holder and a second holder both of which are arranged so as to face each other in the direction of a horizontal axis and adapted so as to rotate about the horizontal axis;

the first holder is provided, on the surface facing the second holder, with:

a plurality of first holding grooves juxtaposed to extend in one direction to depart from the horizontal axis; and a plurality of second holding grooves juxtaposed to extend in another direction to depart from the horizontal axis;

the second holder is provided, on the surface facing the first holder, with:

a plurality of third holding grooves juxtaposed to extend in one direction to depart from the horizontal axis, the third parallel grooves also facing the first parallel grooves respectively, in parallel with the first parallel grooves; and a plurality of fourth holding grooves juxtaposed to extend in another direction to depart from the horizontal axis, the fourth parallel grooves also facing the second parallel grooves respectively, in parallel with the second parallel grooves; and wherein the substrates are carried by the first parallel grooves and the third parallel grooves, while the substrates are also carried by the second parallel grooves and the fourth parallel grooves.

The ninth feature of the present invention reside in that the second parallel grooves are formed so as to extend in the direction to depart from the horizontal axis, opposite to the direction that the first parallel grooves extend, while the fourth parallel grooves are formed so as to extend in the direction to depart from the horizontal axis, opposite to the direction that the third parallel grooves extend.

The tenth feature of the present invention reside in that the substrate transporting apparatus further comprises:

a substrate loading and unloading section for loading and unloading the substrates;

a substrate processing section for applying a designated treatment on the substrates; and substrate transporting means for transporting the substrates in the substrate processing section;

wherein the horizontal holding means serves to receive the substrates from the substrate loading and unloading section and send the substrates to the substrate loading and unloading section; and the vertical holding means serves to receive the substrates from the substrate transporting means and send the substrates to the substrate transporting means in the substrate processing section.

The eleventh feature of the present invention reside in that, providing that either one of directions along which the first parallel grooves are successively formed is defined as a first direction while an opposite direction to the first direction is defined as a second direction, respective lateral portions of the first and third parallel grooves in the first direction are positioned on the opposite side of respective lateral portions of the second and fourth parallel grooves in the second direction, putting the horizontal axis therebetween.

The twelfth feature of the present invention reside in that the second parallel grooves are formed so as to extend in the direction of departing from the horizontal axis and intersecting with the extending direction of the first parallel grooves, while the fourth parallel grooves are formed so as to extend in the direction of departing from the horizontal axis and intersecting with the extending direction of the third parallel grooves.

The thirteenth feature of the present invention reside in that the substrate transporting apparatus further comprises:

a substrate loading and unloading section for loading and unloading the substrates;

a substrate processing section for applying a designated treatment on the substrates; and substrate transporting means for transporting the substrates in the substrate processing section;

wherein the horizontal holding means serves to receive the substrates from the substrate loading and unloading section and send the substrates to the substrate loading and unloading section; and the vertical holding means serves to receive the substrates from the substrate transporting means and send the substrates to the substrate transporting means in the substrate processing section.

The fourteenth feature of the present invention reside in that the posture changing means further includes moving means for moving the first holder to and away from the second holders relatively and rotating means for rotating the first holder and the second holder about the horizontal axis.

The fifteenth feature of the present invention reside in that the horizontal holding means is movable relatively to the posture changing means in the horizontal direction.

The sixteenth feature of the present invention reside in that the horizontal holding means is provided with a plurality of holding parts which horizontally hold the substrates independently of each other.

The seventeenth feature of the present invention reside in that the vertical holding means is movable relatively to the posture changing means in both horizontal and vertical directions.

The eighteenth feature of the present invention reside in that the vertical holding means is movable relatively to the posture changing means in both horizontal and vertical directions and also rotatable in a horizontal plane.

The nineteenth feature of the present invention reside in that the first, second, third and fourth holding grooves of the first and second holders are provided with exhaust holes connected with exhaust means.

The twentieth feature of the present invention reside in that a method of transporting a plurality of substrates by using a substrate transporting apparatus comprising:

horizontal holding means for holding a plurality of substrates at intervals, horizontally;

vertical holding means for holding the substrates at intervals, vertically; and posture changing means for changing the posture of the substrates from horizontal arrangement thereof to the vertical arrangement and vice versa, the posture changing being disposed between the horizontal holding means and the vertical holding means;

wherein said posture changing means includes first and second holders which are arranged so as to face each other in the direction of a horizontal axis and adapted so as to rotate about a horizontal axis;

the first holder is provided, on a surface thereof facing the second holder, with a plurality of first holding grooves juxtaposed so as to extend in a direction to depart from the horizontal axis and a plurality of second holding grooves juxtaposed so as to extend in another direction to depart from the horizontal axis and be different from the direction along which the first holding grooves extend;

the second holder is provided, on a surface thereof facing the first holder, with a plurality of third holding grooves juxtaposed so as to extend in a direction to depart from the horizontal axis, the third holding grooves also facing the first holding grooves respectively, in parallel with the first holding grooves, and a plurality of fourth holding grooves juxtaposed so as to extend in another direction to depart from the horizontal axis and be different from the direction along which said third holding grooves extend, the fourth holding grooves also facing the second holding grooves respectively, in parallel with the second holding grooves;

the second holding grooves are formed so as to extend in the direction to depart from the horizontal axis, opposite to the direction that the first holding grooves extend, while the fourth holding grooves are formed so as to extend in the direction to depart from the horizontal axis, opposite to the direction that the third holding grooves extend.

the substrate is carried by the first holding grooves and the third holding grooves, while the substrate is also carried by the second holding grooves and the fourth holding grooves, the method comprising the steps of:

holding unprocessed ones of the substrates by the first and third holding grooves; and holding processed ones of the substrates by the second and fourth holding grooves.

The twenty first feature of the present invention reside in that providing that either one of directions along which the first holding grooves are successively formed is defined as a first direction while an opposite direction to the first direction is defined as a second direction, respective half portions of the first and third holding grooves on a side of the first direction are positioned on the opposite side of respective half portions of the second and fourth holding grooves on a side of the second direction, putting the horizontal axis therebetween;

the method further comprising the steps of:

holding unprocessed ones of the substrates by the respective half portions of the first and third holding grooves on a side of the first direction; and holding processed ones of the substrates by the respective half portions of the second and fourth holding grooves on a side of the second direction.

The twenty second feature of the present invention reside in that a method of transporting a plurality of substrates by using a substrate transporting apparatus comprising:

horizontal holding means for holding a plurality of substrates at intervals, horizontally;

vertical holding means for holding the substrates at intervals, vertically; and posture changing means for changing the posture of the substrates from horizontal arrangement thereof to the vertical arrangement and vice versa, the posture changing being disposed between the horizontal holding means and the vertical holding means;

wherein the posture changing means includes first and second holders which are arranged so as to face each other in the direction of a horizontal axis and adapted so as to rotate about a horizontal axis;

the first holder is provided, on a surface thereof facing the second holder, with a plurality of first holding grooves juxtaposed so as to extend in a direction to depart from the horizontal axis and a plurality of second holding grooves juxtaposed so as to extend in another direction to depart from the horizontal axis and be different from the direction along which the first holding grooves extend;

the second holder is provided, on a surface thereof facing the first holder, with a plurality of third holding grooves juxtaposed so as to extend in a direction to depart from the horizontal axis, the third holding grooves also facing the first holding grooves respectively, in parallel with the first holding grooves, and a plurality of fourth holding grooves juxtaposed so as to extend in another direction to depart from the horizontal axis and be different from the direction along which the third holding grooves extend, the fourth holding grooves also facing the second holding grooves respectively, in parallel with the second holding grooves;

the second holding grooves are formed so as to extend in the direction to depart from the horizontal axis, opposite to the direction that the first holding grooves extend, while the fourth holding grooves are formed so as to extend in the direction to depart from the horizontal axis, opposite to the direction that the third holding grooves extend.

the substrate is carried by the first holding grooves and the third holding grooves, while the substrate is also carried by the second holding grooves and the fourth holding grooves, the method comprising the steps of:

in case of delivering an unprocessed substrate, positioning the first and second holders of the posture changing means so that the first, second, third and fourth holding grooves thereof extend horizontally;

delivering the unprocessed substrate horizontally held by the horizontal holding means to the first and third holding grooves;

rotating the first and second holders about the horizontal axis by an angle of 90 degrees thereby to hold the unprocessed substrate vertically;

delivering the unprocessed substrate vertically held by the first and second holders to the vertical holding means;

in case of delivering a processed substrate, positioning the first and second holders of the posture changing means so that the first, second, third and fourth holding grooves thereof extend vertically;

delivering the processed substrate vertically held by the vertical holding means to the second and fourth holding grooves;

rotating the first and second holders about the horizontal axis by an angle of 90 degrees thereby to hold the processed substrate horizontally; and delivering the processed substrate horizontally held by the first and second holders to the horizontal holding means.

The twenty third feature of the present invention reside in that providing that either one of directions along which the first holding grooves are successively formed is defined as a first direction while an opposite direction to the first direction is defined as a second direction, respective half portions of the first and third holding grooves on a side of the first direction are positioned on the opposite side of respective half portions of the second and fourth holding grooves on a side of the second direction, putting the horizontal axis therebetween;

the method further comprising the steps of:

delivering the unprocessed substrate horizontally held by the horizontal holding means to the half portions of the first and third holding grooves in the first direction;

delivering the processed substrate vertically held by the vertical holding means to the half portions of the second and fourth holding grooves in the second direction;

The twenty fourth feature of the present invention reside in that a method of transporting a plurality of substrates further comprising, in delivering the substrates between said posture changing means and the vertical holding means, the steps of:

providing the vertical holding means with a plurality of grooves for holding the substrates formed at a pitch equal to half of the pitch at which the first, second, third and fourth holding grooves are formed on the first and second holders of the posture changing means;

first delivering the substrates held by the posture changing means to every other grooves of the vertical holding means;

holding the substrates by the posture changing means again;

arranging the vertical holding means and the posture changing means such a way that the vertical holding means are shifted by one pitch of said grooves of the vertical holding means with respect to the posture changing means; and second delivering said substrates held by the posture changing means to every other remaining grooves between the substrates which have been delivered to the vertical holding means at the first delivering step.

The twenty fifth feature of the present invention reside in that a method of transporting a plurality of substrates further comprising, in delivering the substrates between the posture changing means and the vertical holding means, the steps of:

providing the vertical holding means with a plurality of grooves for holding the substrates formed at a pitch equal to half of the pitch at which the first, second, third and fourth holding grooves are formed on the first and second holders of the posture changing means;

holding the substrates so that respective front faces thereof direct one direction, by the posture changing means;

first delivering the substrates held by the posture changing means to every other groove of the vertical holding means;

holding the substrates so that the respective front faces thereof direct the same direction as that at the first delivering step, by the posture changing means again;

rotating the vertical holding means to which the substrates are delivered at the first delivering step, by an angle of 180 degrees;

arranging the vertical holding means and the posture changing means such a way that the vertical holding means are shifted by one pitch of the grooves of the vertical holding means with respect to the posture changing means, so that the grooves of the posture changing means correspond to every other remaining grooves between said substrates which have been delivered to the vertical holding means at the first delivering step; and second delivering the substrates held by the posture changing means to said every other remaining grooves between the substrates, whereby the substrates are held by the vertical holding means so that respective adjoining substrates of the substrates face each other with their front faces thereof or their back faces.

The twenty sixth feature of the present invention reside in that a method of transporting a plurality of substrates further comprising, in delivering the substrates between the posture changing means and the vertical holding means, the steps of:

holding the substrates each having a front face and a back face by the grooves of the vertical holding means so as to turn respective directions from back to front of said substrates one by one, whereby respective front faces of the substrates face each other and respective back faces of the substrates face each other;

arranging the grooves of said posture changing means so as to correspond to every other groove of the grooves of the vertical holding means;

first delivering the substrates held by every other groove of the vertical holding means to the grooves of the posture changing means;

rotating the vertical holding means from which the substrates are delivered at the first delivering step, by an angle of 180 degrees;

arranging the vertical holding means and the posture changing means such a way that the vertical holding means are shifted by one pitch of the grooves of the vertical holding means with respect to the posture changing means, so that the grooves of the posture changing means correspond to every other grooves in which the substrates have remained and have not been delivered to the posture changing means at the first delivering step; and second delivering the substrates held by every other groove of the vertical holding means to the grooves of the posture changing means, whereby respective front faces of the substrates delivered at the first delivering step and respective front faces of the substrates delivered at the second delivering step direct in the same direction together.

The above and other features and advantages of this invention will become apparent, and the invention itself will best be understood, from a study of the following description and appended claims, with reference had to the attached drawings showing a preferred embodiment of the invention.

DESCRIPTION OF THE PREFERRED EMBODIMENT

An embodiment of the present invention will be described with reference to drawings, taking an instance of applying the present invention on to a cleaning system for semiconductor wafers.

Figure 1:
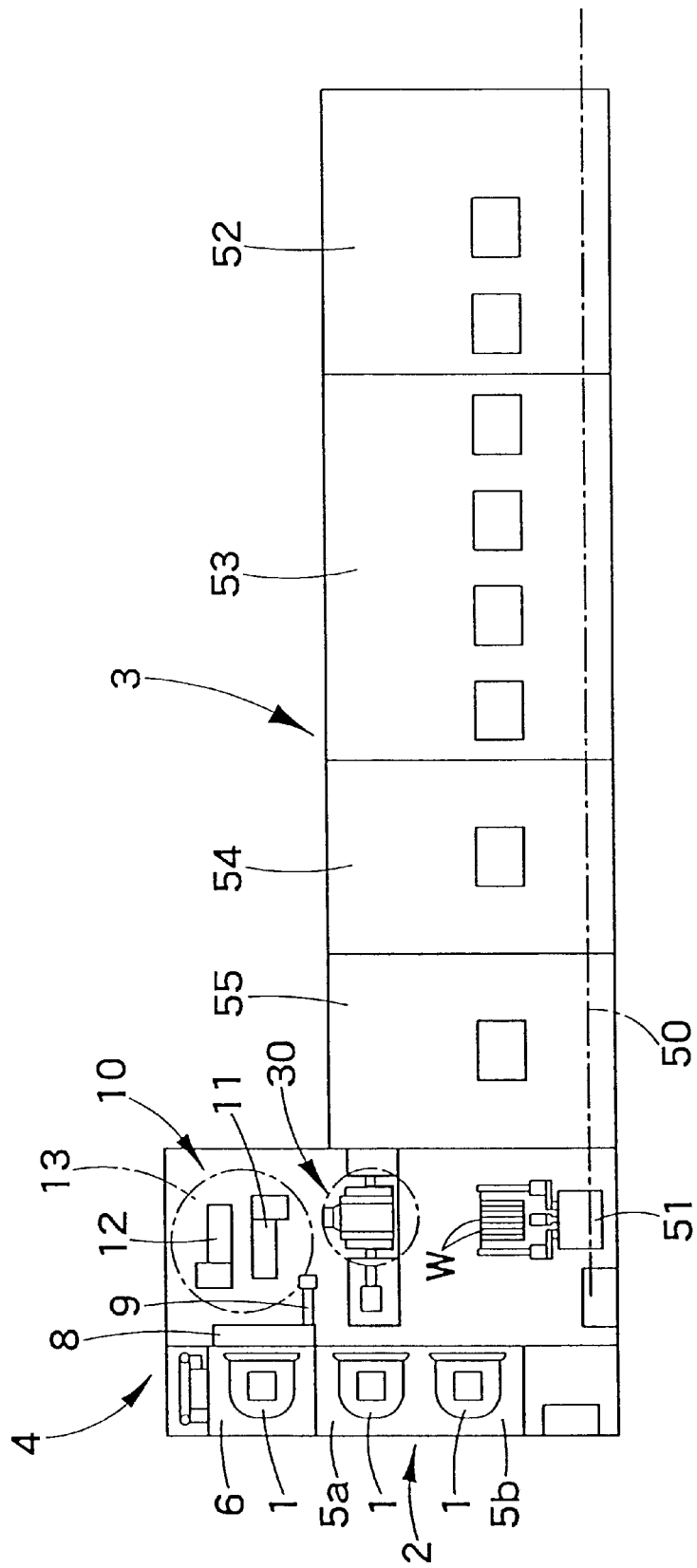
FIG. 1 is a schematic plan view of a cleaning system to which a substrate transporting apparatus according to the present invention is applied.
Figure 2:
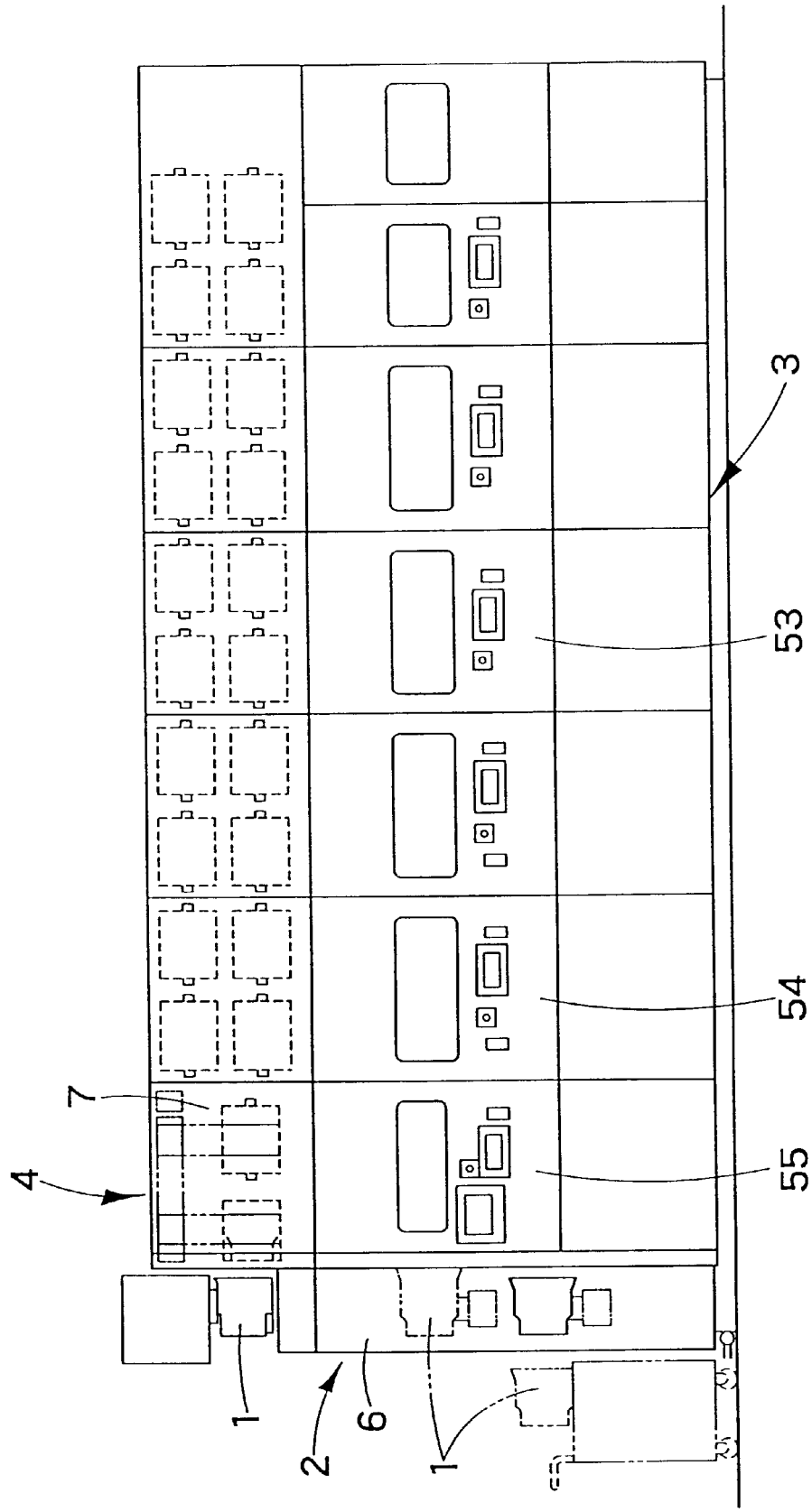
FIG. 2 is a schematic side view of the cleaning system.

FIG. 1 is a schematic plan view of a cleaning system to which a substrate transporting apparatus of the present invention is applied and FIG. 2 is a schematic side view of the cleaning system.

The above cleaning system is mainly constituted by a loading and unloading section 2 for loading and unloading a container, for example a carrier 1 for accommodating semiconductor wafers W (referred as "wafers", hereinafter) as the substrates to be processed horizontally, a processing section 3 for cleaning the wafers W by using chemicals, cleaning liquids etc. and sequentially drying them and an interface section 4 positioned between the loading and unloading section 2 and the processing section 3, for delivering the wafers W from the section 2 to the section 3 and vice versa, and adjusting respective positions, postures and intervals of the wafers W.

The loading and unloading section 2 comprises a carrier input part 5a and a carrier output part 5b, both of which are juxtaposed on one side of the cleaning system, and a wafer delivery part 6. Arranged between the carrier input part 5a and the wafer delivery part 6 is a not-shown transporting mechanism which conveys the carriers 1 from the carrier input part 5a to the wafer delivery part 6.

Carrier lifters (also not shown) are respectively provided in the output part 5b and the wafer delivery part 6. The carrier lifters serves to deliver the vacant carriers 1 to a carrier stand-by part 7 above the loading and unloading section 2 and also receive the vacant carriers 1 from the carrier stand-by part 7. In the carrier stand-by part 7, a carrier conveyer robot (not shown) is arranged so as to move in the horizontal directions (X, Y) and the vertical direction (Z). Owing to the provision of the carrier conveyer robot, the vacant carriers 1 fed from the wafer delivery part 6 can be lined up and also fed to the carrier output part 5b. Note, the carrier stand-by part 7 also allows not only the vacant carriers but the carriers 1 accommodating the wafers W to stand by.

Figure 3:
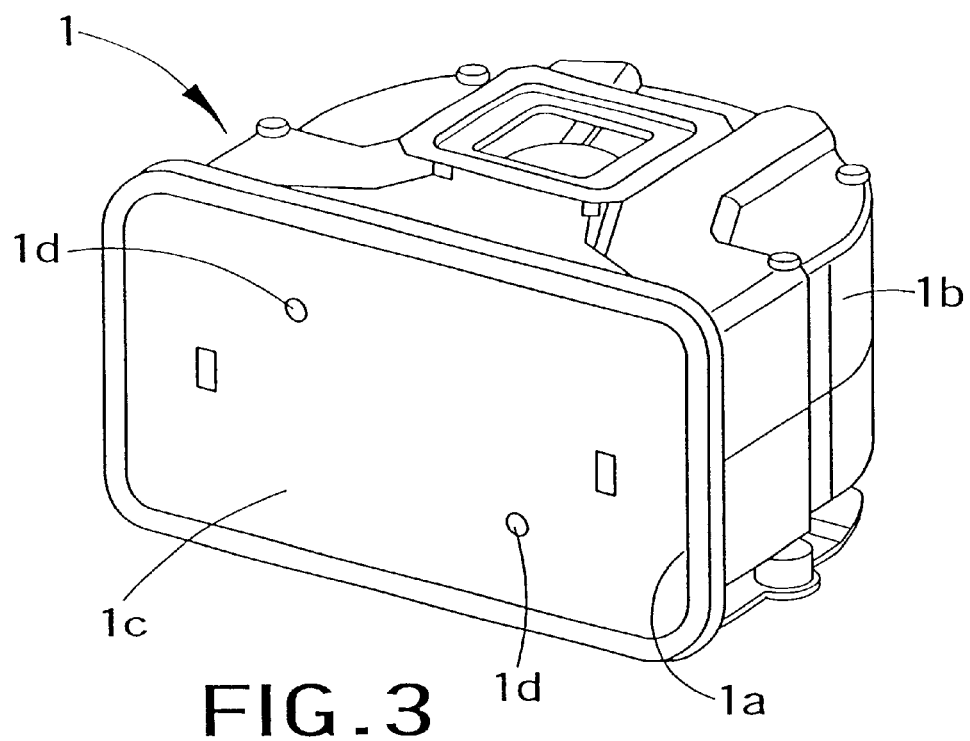
FIG. 3 is a perspective view of a carrier as an example according to the present invention.
Figure 4:
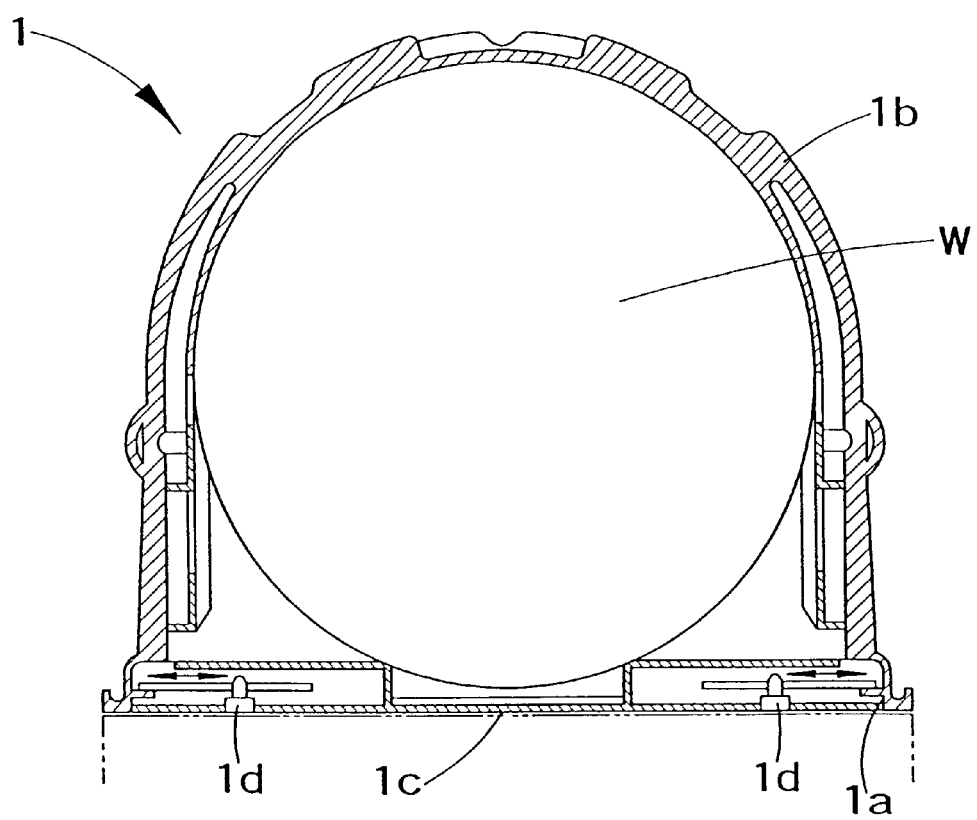
FIG. 4 is a cross-sectional view of the carrier.
Figure 5:
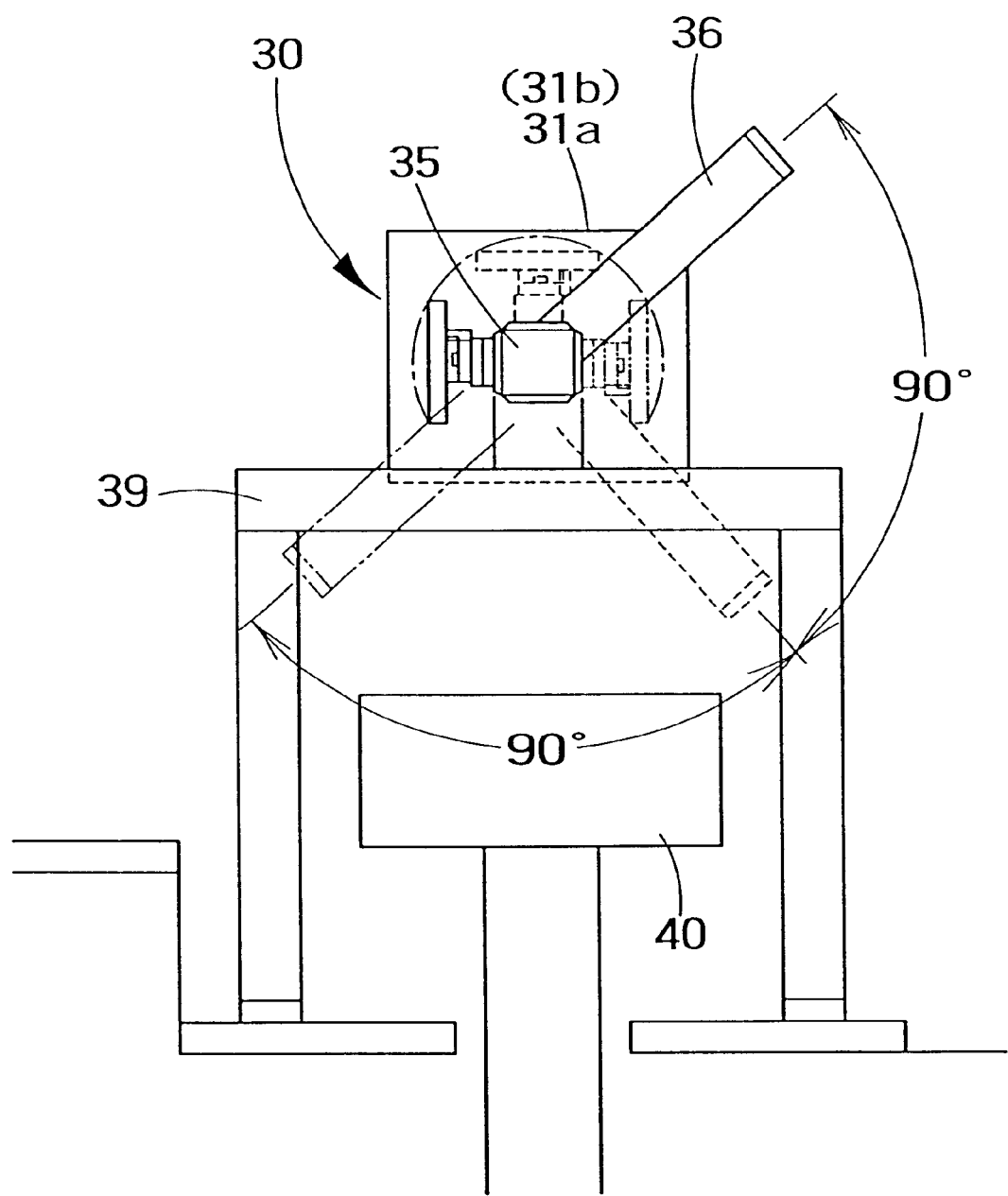
FIG. 5 is a schematic side view of a posture changing device according to the present invention.
Figure 6:
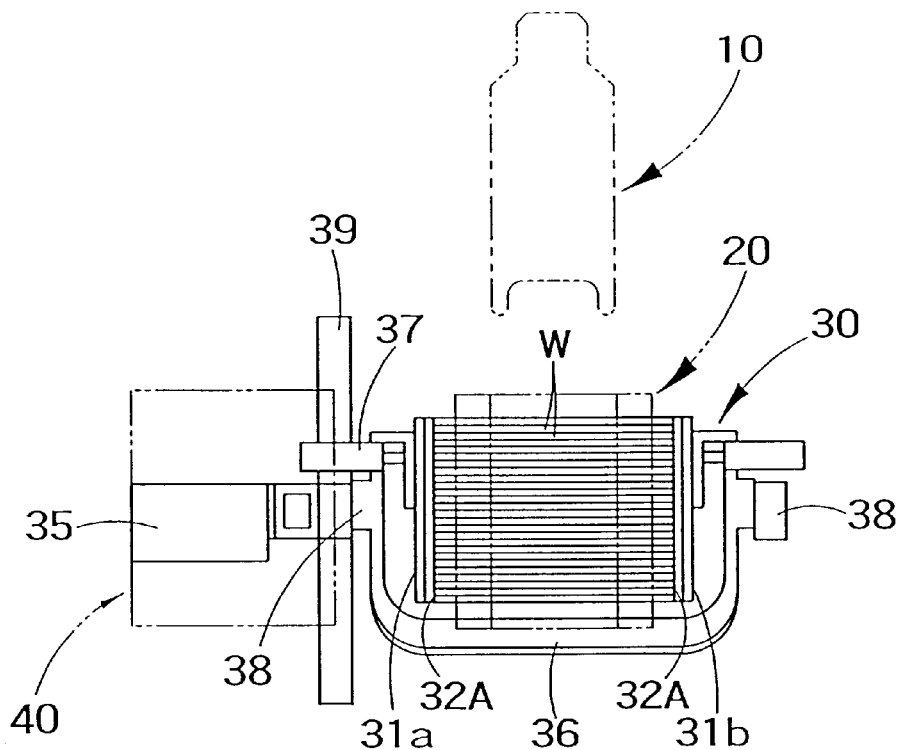
FIG. 6 is a schematic plan view of the posture changing device.
Figure 7:
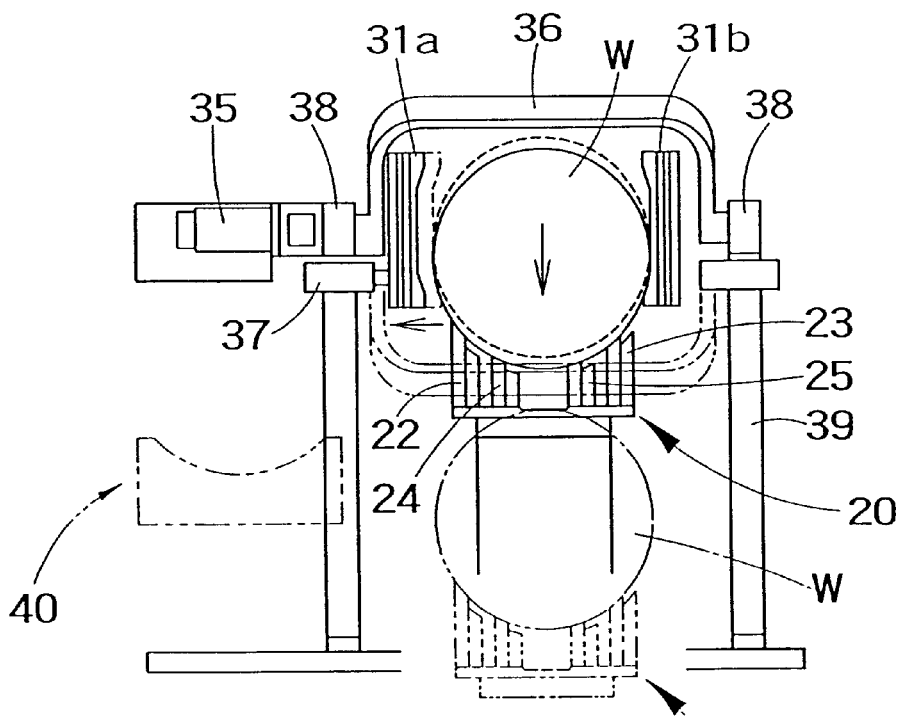
FIG. 7 is a side view of the posture changing device shown in FIG. 6.
Figure 8:
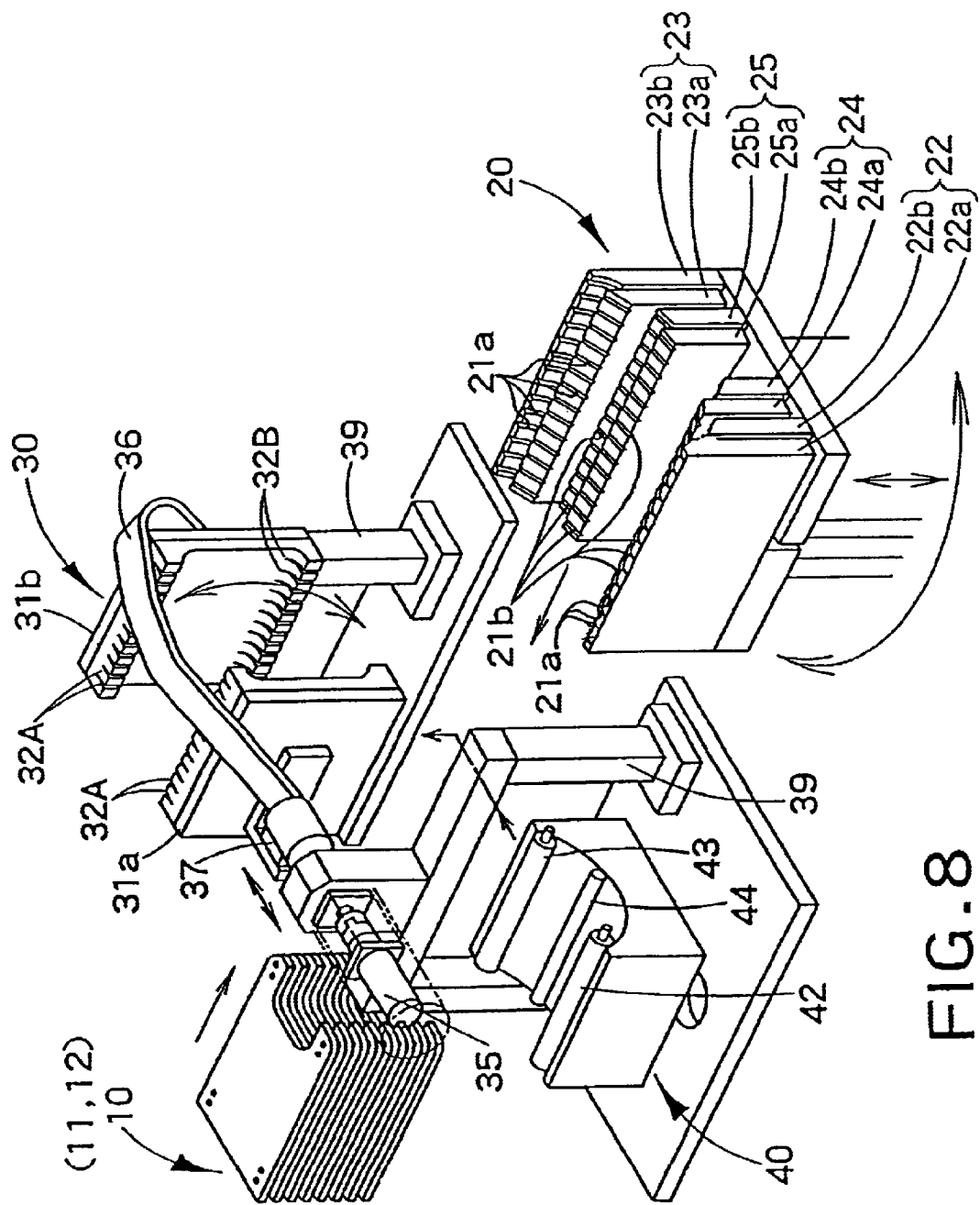
FIG. 8 is a perspective view showing the posture changing device, a wafer transporting arm, a notch aligner and the pitch-changer according to the invention.
Figure 9:
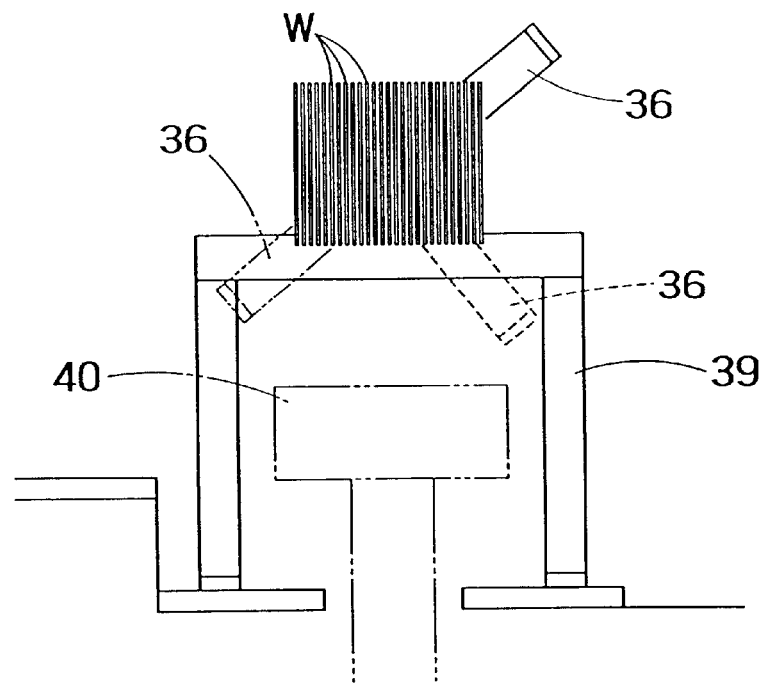
FIG. 9 is schematic side view of the posture changing device holding wafers perpendicularly.

As shown in FIGS. 3 and 4, each carrier 1 is constituted by a container body 1b having an opening 1a on one side and a lid body 1c for closing the opening 1a of the container body 1b. The container body 1b is provided, on an inner wall thereof, with holding grooves (not shown) for holding the plural (e.g. 25 pcs.) wafers W at appropriate intervals horizontally. The lid body 1c is provided with an engagement mechanism id which is operated by a lid closing unit 8 (described later) for closing the lid body 1c.

The wafer delivery part 6 opens toward the interface section 4. The above lid closing unit 8 is arranged at the opening part of the wafer delivery part 6. Owing to the provision of the lid closing unit 8, the lid body 1c of the carrier 1 is adapted so as to open or close it. Therefore, it is possible for the lid closing unit 8 to detach the lid body 1c from the container body 1b of the carrier 1 accommodating the unprocessed wafers W therein and fed to the wafer delivery part 6, thereby allowing the wafers W to be unloaded. In addition, after all the wafers W have been unloaded, the carrier 1 can be closed up with the lid body 1c operated by the lid closing unit 8. Also, it is possible for the lid closing unit 8 to detach the lid body 1c from the container body 1b of the vacant carrier 1 which has been fed from the carrier stand-by part 7 to the wafer delivery part 6, thereby allowing the wafers W to be loaded. After all the wafers W have been loaded into the carrier 1, it can be closed up with the lid body 1c operated by the lid closing unit 8. In the vicinity of the opening part of the wafer delivery part 6, a mapping sensor 9 is arranged to detect the number of wafers W accommodated in the carrier 1.

In the interface section 4, there are provided a wafer transfer arm 10 as horizontally-holding means which carries the plural number, for example 25 pcs. of wafers W horizontally and also delivers the horizontally arranged wafers W between the wafer delivery part 6 and the carrier 1, a pitch changer 20 as holding means which holds the plural number, for example 52 pcs. of wafers W at predetermined intervals vertically, a posture changing device 30 as posture changing means which is positioned between the wafer transfer arm 10 and the pitch changer 20, for changing the posture of the plural number, for example 26 pcs. of wafers W into the horizontal or vertical arrangement, and a notch aligner 40 as position detecting means for detecting notches (not-shown) formed on the wafers W of which postures have been changed into the vertical arrangement. In the interface section 4, a transport path 50 is arranged so as to extend to the processing section 3. A wafer transfer chuck 51 as wafers (substrates) transporting means is movably arranged on the transport path 50.

The wafer transfer arm 10 has a pair of holders, for example arm bodies 11, 12 juxtaposed to pick up the plural wafers W from the carriers 1 in the wafer delivery part 6 for transportation and also load the plural wafers W into the carriers 1. Being mounted on a drive table 13 capable of moving in the horizontal directions (X, Y), the vertical direction (Z) and also a rotating direction (θ), the arm bodies 11, 12 are adapted so as to hold the wafers W in the horizontal arrangement independently and also deliver the wafers W between the carriers 1 mounted on the wafer delivery part 6 and the posture changing device 30. Therefore, it is possible to carry the unprocessed wafers W by the arm body 11 on one hand while allowing the processed wafers W to be carried by the other arm body 12.

Figure 10:
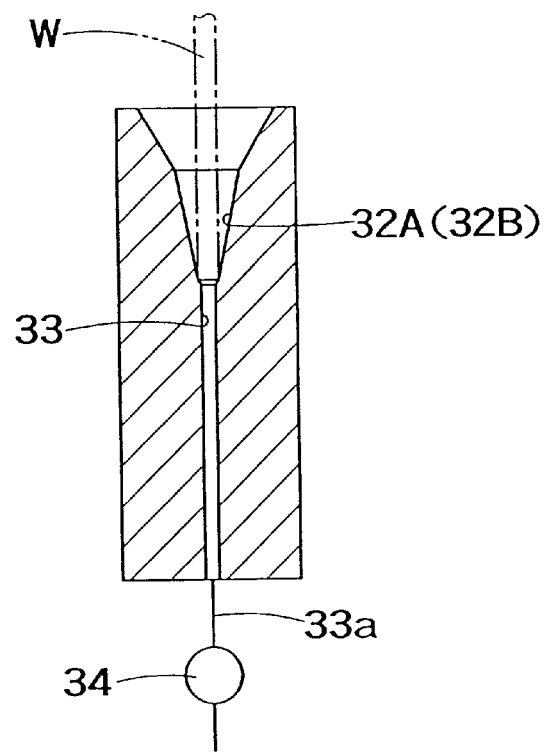
FIG. 10 is an enlarged sectional view of a holding groove of the posture changing device.
Figure 11A:
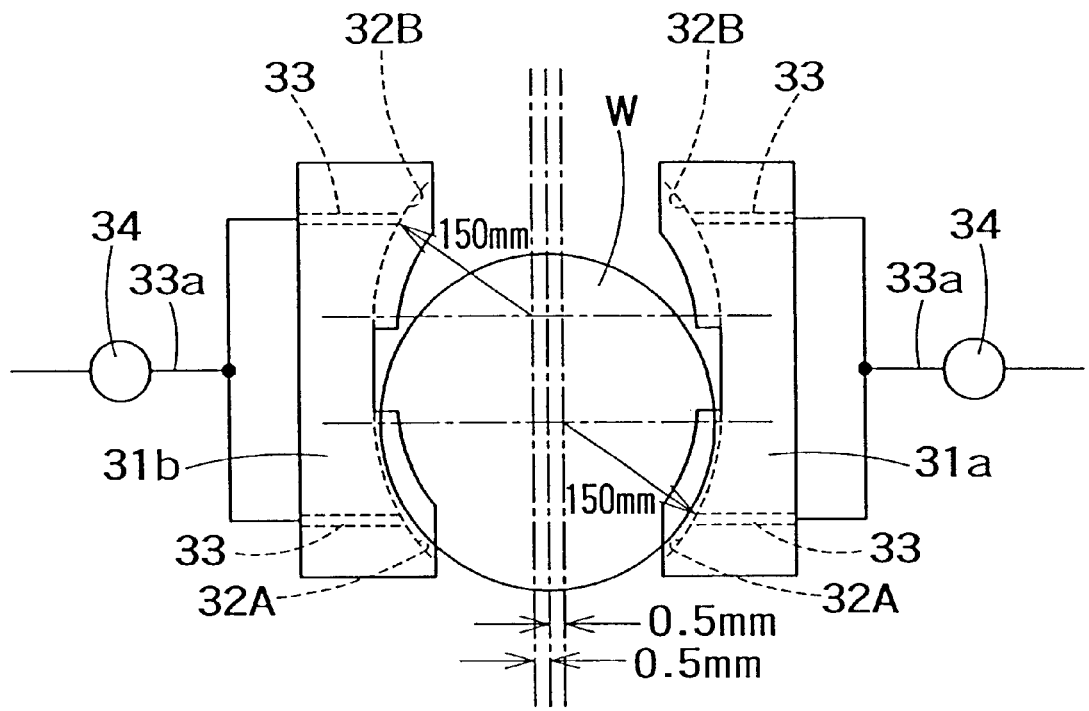
FIG. 11A is a schematic plan view showing a condition where an unprocessed wafer is carried by the posture changing device.
Figure 11B:
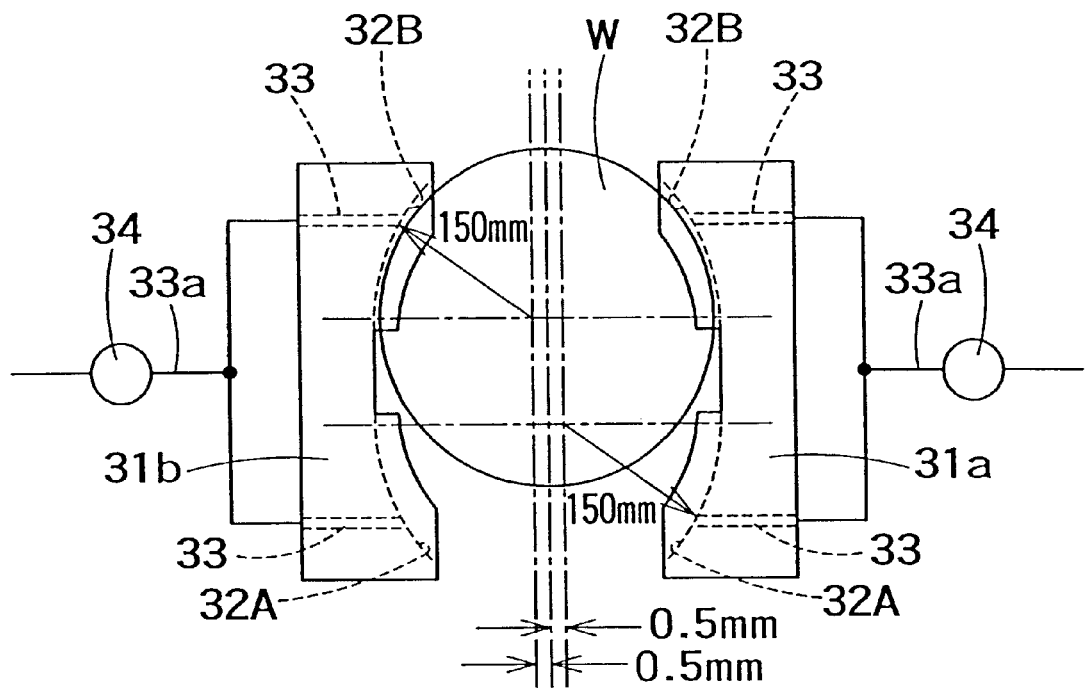
FIG. 11B is a schematic plan view showing a condition where a processed wafer is carried by the posture changing device.

The above posture changing device 30, as shown in FIGS. 5 to 9, includes a pair of generally rectangular-shaped holders 31a, 31b between which the wafers W are interposed. The holder 31a is provided, on the side facing the other holder 31b, with a plurality (e.g. 26 pcs.) of holding grooves 32A at appropriate intervals, for retaining the wafers W independently. Similarly, the holder 31b is provided, on the side facing the other holder 31a, with a plurality (e.g. 26 pcs.) of holding grooves 32B at appropriate intervals, for retaining the wafers W independently. As shown in FIG. 10, the holding grooves 32A, 32B are formed to have generally V-shaped cross sections of which opening sides are further expanded, under consideration of preventing the grooves 32A, 32B from contacting with the wafers W as possible. In addition, as shown in FIGS. 11A and 11B, the holding grooves 32A, 32B are formed to have respective bottom portions each describing an arc with the curvature radius of e.g. 150 mm about a center offset from the center of the wafer W having the diameter of e.g. 300 mm by 0.5 mm. Therefore, when holding the wafers W horizontally, then a little clearance is produced between each bottom portion of the holding grooves 32A, 32B and the wafer W.

The holding grooves 32A, 32B are provided with exhaust holes 33 respectively connected with an exhaust unit 34 as exhaust means, for example a vacuum pump, through the intermediary of exhaust pipes 33a (see FIGS. 10, 11A and 11B). In this way, since the exhaust holes 33 are provided in the holding grooves 32A, 32B and connected with the exhaust unit 34, it is possible to suck particles sticking to the grooves 32A, 32B when holding the wafers W by the holders 31a, 31b and sequentially discharge them to the outside via the exhaust pipes 33a.

Further, both holders 31a, 31b are mounted on a rotating arm 36 detachably linked to a servo-motor 35 as rotating means, so that the holders 31a, 31b can simultaneously rotate in a vertical plane by the drive of the servo-motor 35. Additionally, either one of the holders 31a, 31b, for example the holder 31a on the side of the servo-motor is constructed so as to move forward and backward relatively to the other holder 31b by moving means, for example an air cylinder 37. Note, a support 38 for the holders 31a, 31b, the servo-motor 35 and the air cylinder 37 are arranged on a table 39.

The above notch aligner 40 is provided, on a support 41 thereof, with a pair of guide rollers 42, 43, a drive roller 44 disposed between the guide rollers 42, 43 and a not-shown notch sensor arranged in the vicinity of the guide roller on one hand, for example the guide roller 42. The support 41 is adapted so as to move from the lower and lateral side of the posture changing device 30 to the underside of the device 30 and rise from and fall to the underside of the device 30. To true up respective notches of the wafers W into the same position. namely the positioning of the wafers W is carried out by driving the drive roller 44 to rotate the wafers W in the vertical direction while vertically holding the wafers W by the guide rollers 42, 43 and the drive roller 44. The so-positioned wafers W is transferred to the posture changing device 30 again and sequentially interposed therein vertically.

On the other hand, the pitch changer 20 includes, as shown in FIGS. 12 to 15C, a first holding part 21A and a second holding part 21B both of which include a pair of side-part holding parts 22, 23 having a plurality (e.g. 52 pcs.) of holding grooves 21a for holding both side portions of the wafers W, the holding parts 22, 23 being parallel to each other, and a pair of lower-part holding parts 24, 25 having a plurality (e.g. 52 pcs.) of holding grooves 21b for holding lower portions of the wafers W, the holding parts 24, 25 being also parallel to each other. Further the pitch changer 20 includes a carrier, for example a carrying table 26 for carrying the first holding part 21A and the second carrying part 21B thereon, a directional change motor 27 for changing the horizontal direction of the carrying table 26, a vertical moving mechanism 28 for moving a base 60 mounting the carrying table 26 and the directional change motor 27 thereon in the vertical direction (Z-direction) and a horizontal moving mechanism 62 for moving the base 60 and a slide plate 61 mounting the vertical moving mechanism 28 thereon in the horizontal direction (Y-direction).

In the above arrangement, the carrying table 26 is constituted by a fixed table 26a secured on a rotating plate 27a joined to the directional change motor 27 and a movable table 26b capable of rising and falling by an air cylinder 26c fixed on the rotating plate 27a. The side-part holding parts 22, 23 and the lower-part holding parts 24, 25 forming the first holding part 21A and the second holding part 21B are respectively constituted by the side-part supporting members 22a, 23a and the lower-part supporting members 24a, 25a, all of which are secured on the fixed table 26a to extend above the movable table 26b and the side-part supporting members 22b, 23b and the lower-part supporting members 24b, 25b, all of which are secured on the movable table 26b so as to extend above the fixed table 26a. Thus, the first holding part 21A is composed of the side-part supporting members 22a, 23a and the lower-part supporting members 24a, 25a, while the second holding part 21B is composed of the side-part supporting members 22b, 23b and the lower-part supporting members 24b, 25b.

When the movable table 26b resides in the low position by the drive of the air cylinder 26c, the first holding part 21A fixed on the fixed table 26a, that is, the side-part supporting members 22a, 23a and the lower-part supporting members 24a, 25a support the wafers W vertically. On the contrary, when the movable table 26b resides in the upper position by the drive of the air cylinder 26c, the second holding part 21B, that is, the side-part supporting members 22b, 23b and the lower-part supporting members 24b, 25b support the wafers W vertically.

Figure 15A:
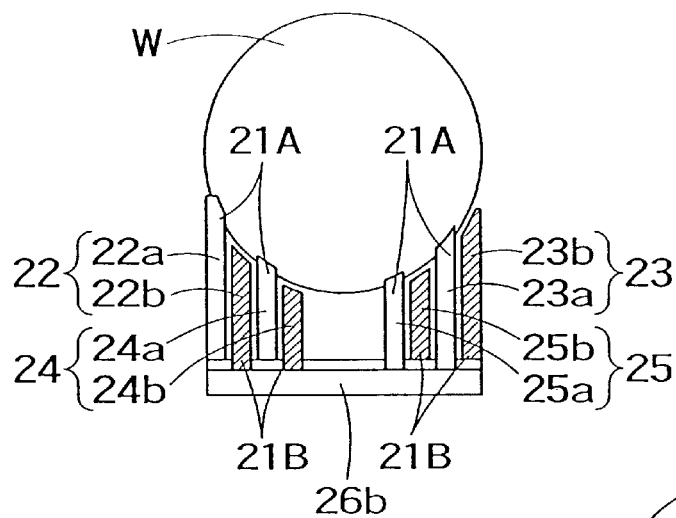
FIG. 15A is a side view showing a condition where an unprocessed wafer is supported by a first holding part of the pitch-changer.
Figure 15B:
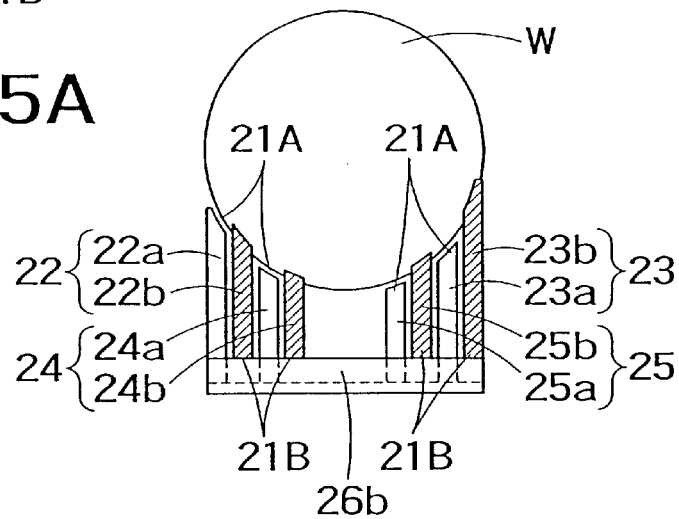
FIG. 15B is a side view showing a condition where an processed wafer is supported by a second holding part of the pitch-changer.
Figure 15C:
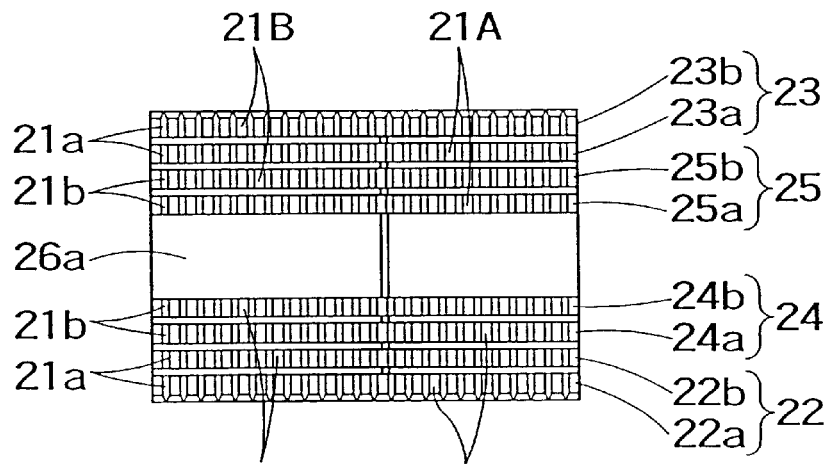
FIG. 15C is a plan view of the holding parts of the pitch-changer.
Figure 16A:
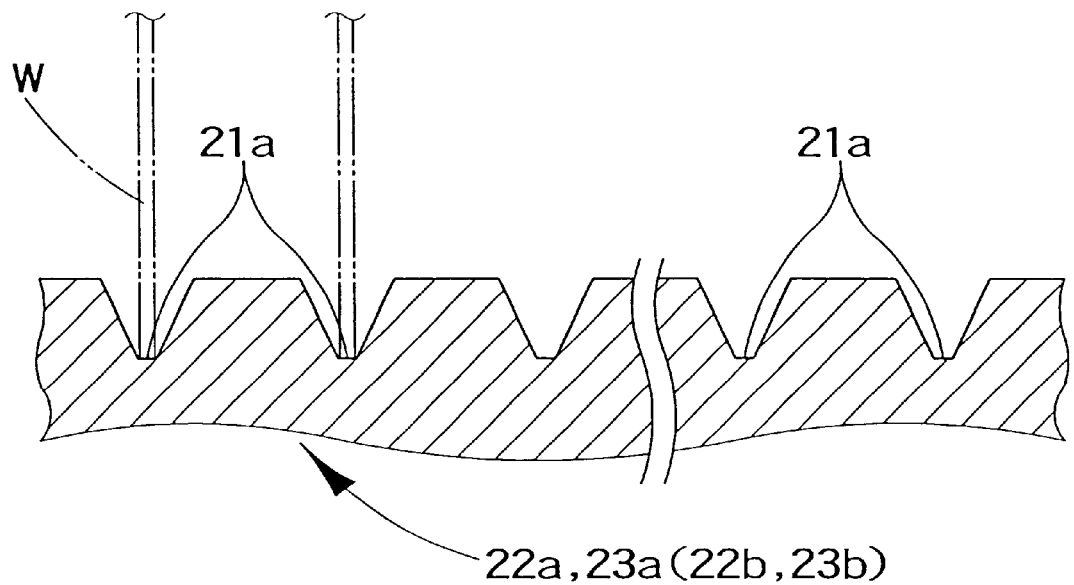
FIG. 16A is an enlarged sectional view of holding grooves provided on a lateral holding member of the invention.
Figure 16B:
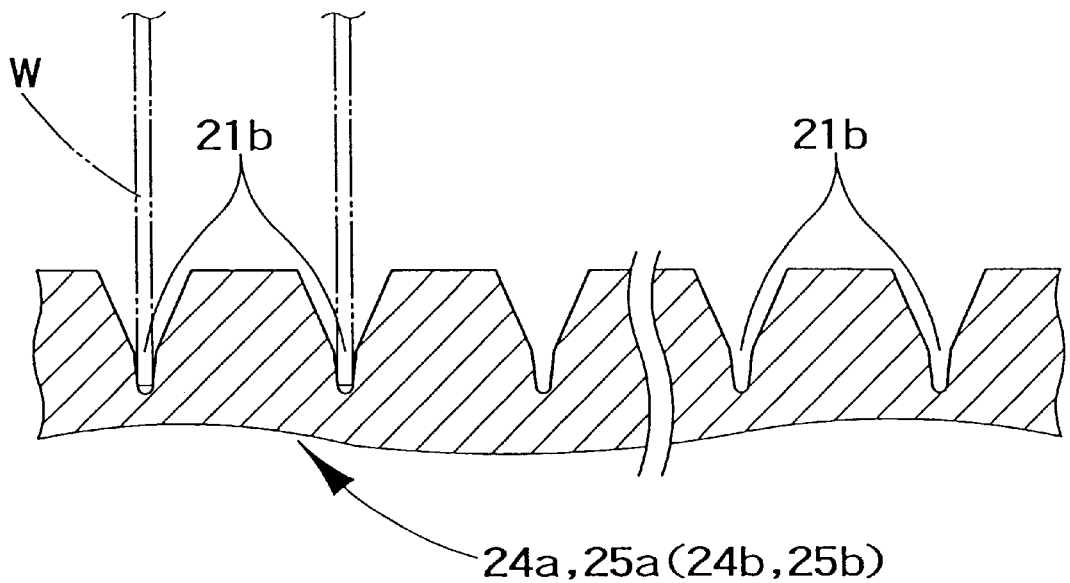
FIG. 16B is an enlarged sectional view of holding grooves provided on a lower holding member of the invention.

In the above arrangement, as shown in FIGS. 15A and 15B, the holding condition for the wafers W due to the pair of side-part supporting members 22a, 23a and the pair of lower-part supporting members 24a, 25a mounted on the fixed table 26a, is in symmetry with the holding condition for the wafers W due to the pair of side-part supporting members 22b, 23b and the pair of lower-part supporting members 24b, 25b mounted on the movable table 26b, as a center of the center line of the wafer W. Further, the holding grooves 21a lined up on the side-part supporting members 22a, 23a; 22b, 23b are formed to have general V-shaped cross sections thereby to hold the wafers W as shown in FIG. 16A, while the holding grooves 21b lined up on the lower-part supporting members 24a, 25a; 24b, 25b are formed to have general Y-shaped cross sections thereby to prevent the wafers W from inclining as shown in FIG. 16B. Therefore, it is possible to not only hold the processed wafers W and the unprocessed wafers W under the substantially same conditions but hold the wafers W at predetermined intervals under the stabilized condition. Note, although the horizontal X-direction of the wafers W held by the pitch changer 20 is constant basically, in case of existing deviations on accuracy tolerance, then the wafer transfer chuck 51 moving in the X-direction could absorb such a tolerance. Further, in the Z-direction, although there is produced a deviation between the holding condition against the unprocessed wafers W and the holding condition against the processed wafers W, then the vertical moving mechanism 28 that the pitch changer 20 includes can absorb the deviation.

Note, each pitch of fifty-two pieces of holding grooves 21a, 21b lined up on the side-part holding parts 22, 23, i.e. the side-part supporting members 22a, 23a; 22b, 23b and the lower-part holding parts 24, 24, i.e. the lower-part supporting members 24a, 25a; 24b, 25b is set to be half of each pitch of twenty-six pieces of holding grooves 32A, 32B formed on the holder 31 of the posture changing device 30. Additionally, it is noted that the side-part supporting members 22a, 23a; 22b, 23b and the lower-part supporting members 24a, 25a; 24b, 25b have to be provided with strength to a certain extent since they are fixed on the fixed table 26a and the movable table 26b in a cantilever manner, respectively. Therefore, in the embodiment, for example stainless core rods are coated with synthetic resin of polyether ether-ketone (PEEK), providing the respective supporting members.

The afore-mentioned vertical moving mechanism 28 consists of a screw shaft 28b rotated by a reverse-rotatable motor 28a in the vertical arrangement and a ball screw of a nut 28c threadly engaging with the screw shaft 28b through the intermediary of a number of ball (not shown). Note, the base 60 has a slide element 28e sliding on a pair of guide rails 28d laid in parallel with the screw shaft 28a. Again, the afore-mentioned moving mechanism 62 consists of a screw shaft 64 rotated by a reverse-rotatable motor 63 in the horizontal arrangement and a ball screw of a nut 65 threadly engaging with the screw shaft 64 through the intermediary of a number of ball (not shown). Upon fixing the so-constructed moving mechanism, i.e. the nut 65 of the ball screw 62 on the slide plate 61 and slidably engaging sliding elements 66 attached to the slide plate 61 with a pair of guide rails 67 laid in parallel with the screw shaft 64 while driving the motor 63, it is possible to move the base 60 attached to the slide plate 61 and the carrying table 26 etc. in the direction Y.

With the so-constructed arrangement, it is possible to move the pitch changer 20 to both downsides of the posture changing device 30 and the wafer transfer chuck 51. Further, by respectively elevating the pitch changer 20 with respect to the posture changing device 30 and the wafer transfer chuck 51, it is also possible to deliver the wafers W between the pitch changer 20 and the posture changing device 30 and between the pitch changer 20 and the wafer transfer chuck 51, respectively.

On the other hand, in the processing section 3, there are straight arranged a first processing unit 52 for removing particles and organic contaminants sticking to the wafers W, a second processing unit 53 for removing metal contaminants sticking to the wafers W, a cleaning and drying unit 54 for removing chemical oxide films sticking to the wafers W and sequentially drying them and a chuck cleaning unit 55. Arranged on the transport path 50 opposing the respective units 52 to 55 are the wafer transfer chuck (wafer transporting means) which is capable of moving in the directions (X, Y) and rotating in the direction (θ). Note, it is not always necessary to arrange the chuck cleaning unit 55 between the cleaning and drying unit 54 and the interface section 4. Thus, for example, the chuck cleaning unit 55 may be provided between the second processing unit 53 and the cleaning and drying unit 54. Alternatively, the unit 55 may be disposed adjacent to the first processing unit 52.

Figure 12:
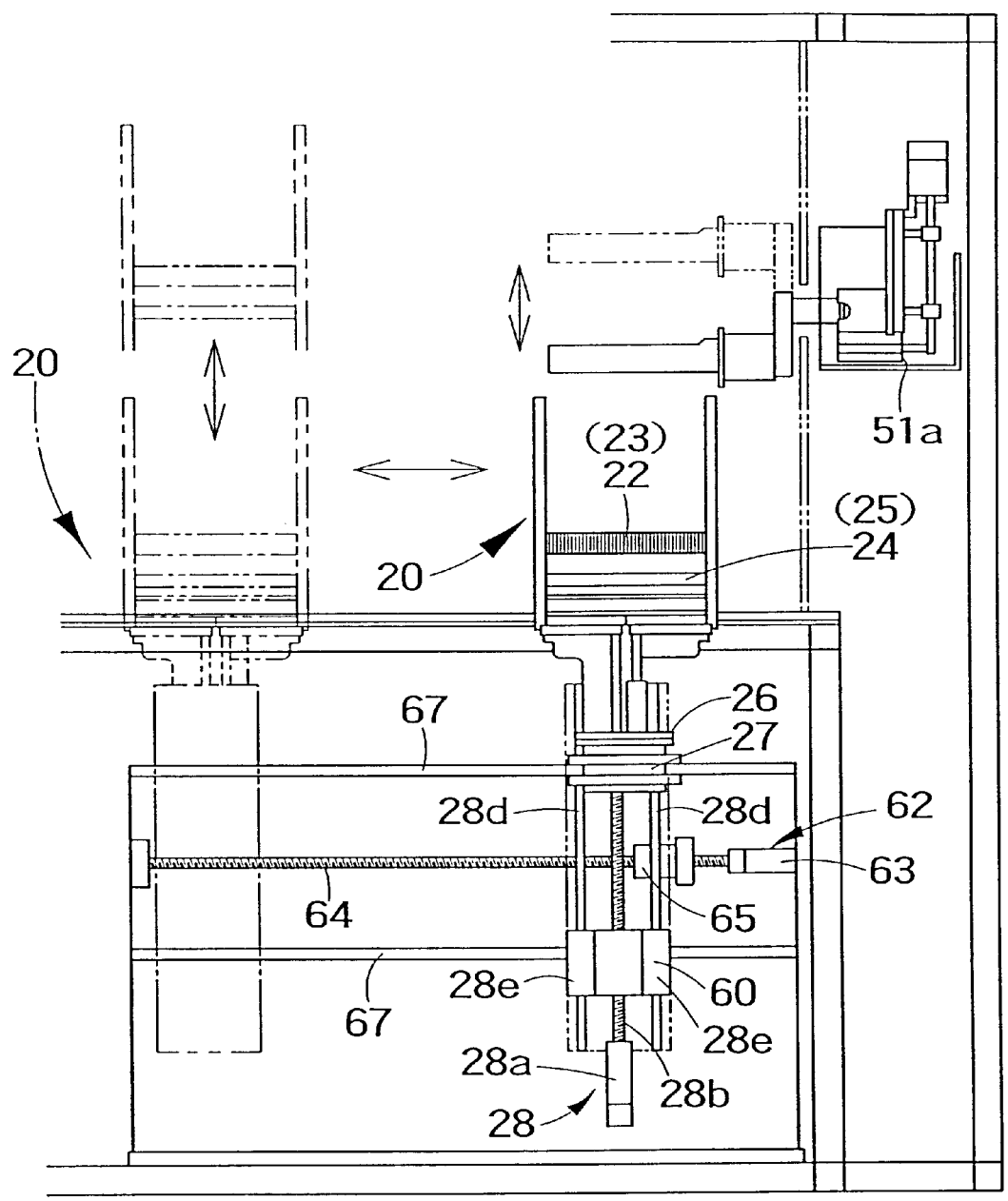
FIG. 12 is a schematic side view showing the pitch-changer according to the invention.
Figure 13:
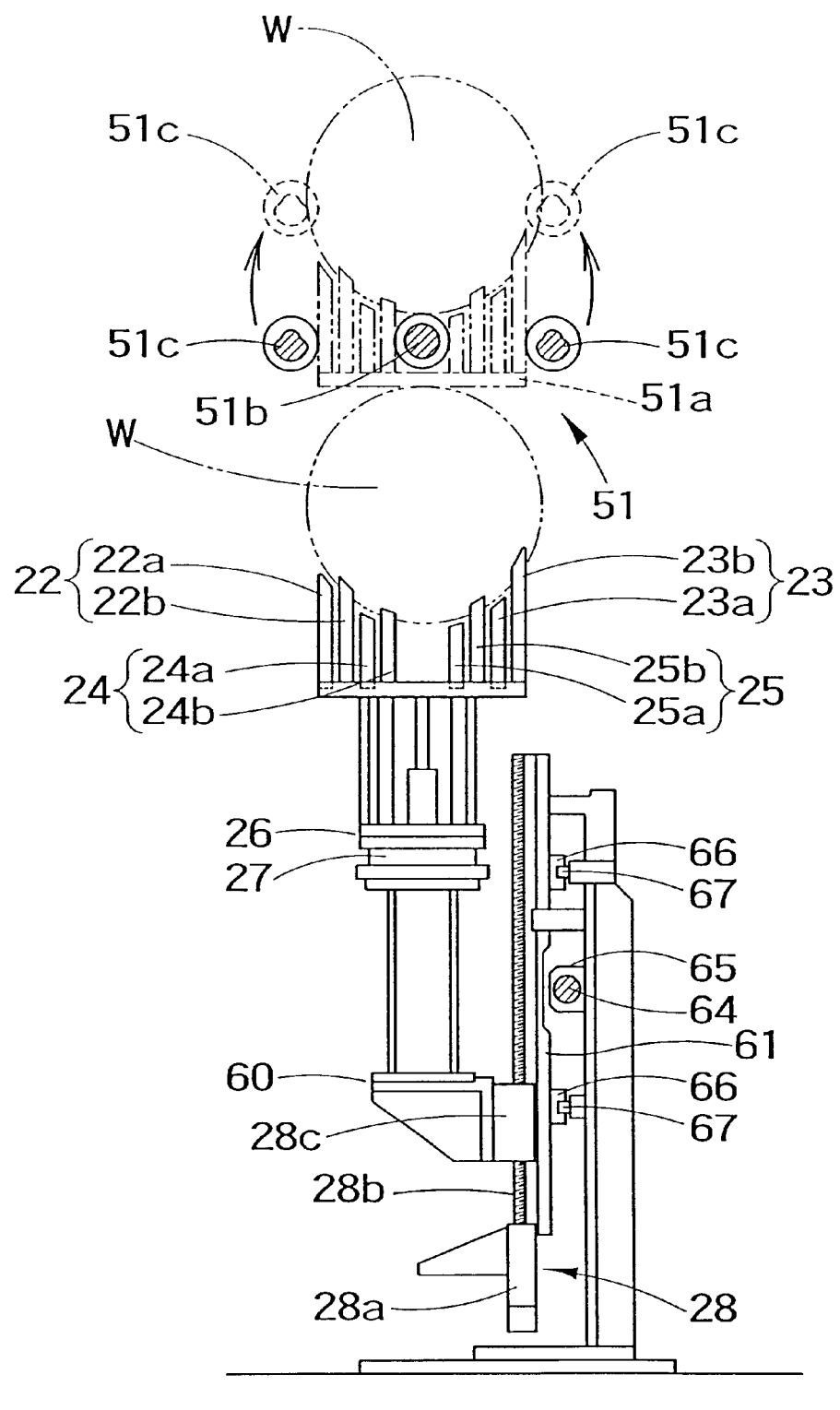
FIG. 13 is another side view of the pitch-changer shown in FIG. 12.
Figure 14:
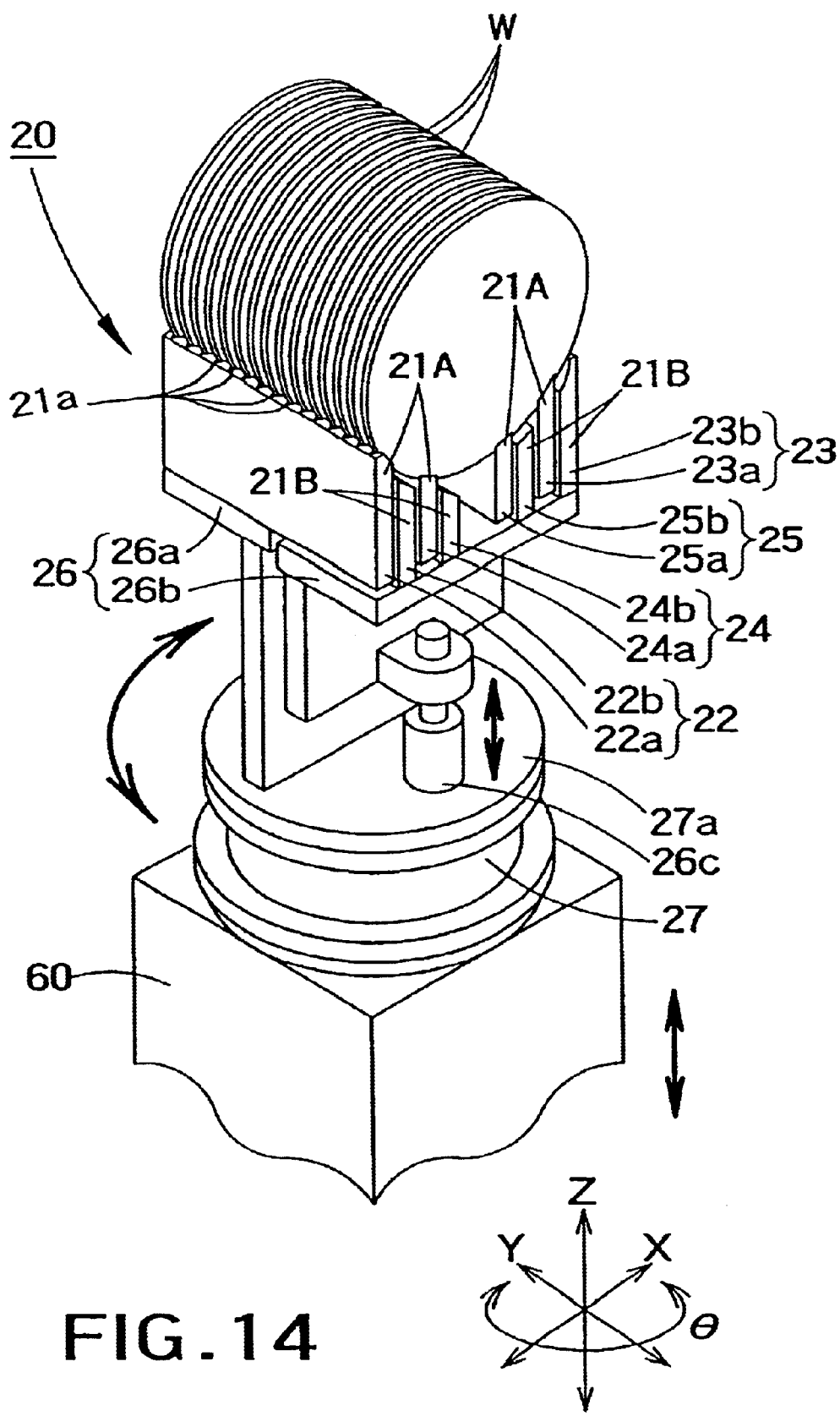
FIG. 14 is a perspective view showing an essential part of the pitch-changer of the invention.

In the above arrangement, as shown in FIGS. 1, 12 and 13, the wafer transfer chuck 51 is constituted by an elevating drive table 51a moving along a guide rail (not shown) provided on the transport path 50, a lower-part holding arm 51b projecting from the drive table 51a and a pair of side-part holding arms 51c which are movable to the lower-part holding arm 51b in an arc.

Next, we describe the transporting and processing steps for the wafers W carried out by the above cleaning unit. First of all, when putting the carrier 1 accommodating the unprocessed wafers W on the carrier input part 5a by an operator or a conveyer robot, then a not-shown transporting mechanism moves, so that the carrier 1 is loaded into the wafer unloading and loading section 6. Next, the carrier 1 loaded into the wafer unloading and loading section 6 stands ready toward the interface section 4 while the lid body 1c of the carrier 1 is being opened by the lid closing unit 8. During this carrier's stand-by operation, the mapping sensor 9 operates to detect the number of wafers W accommodated in the carrier 1.

After detecting the number of wafers W in the carrier 1 by the mapping sensor 9, the wafer transfer arm 10 (in detail, the arm body 11) arranged in the interface section 4 enters into the carrier 1 to pick up the plural (e.g. 25 pcs.) wafers W accommodated in the carrier 1 and sequentially conveys the picked wafers W to the posture changing device 30 and moves them between the pair of holders 31a, 31b waiting under their opened condition. Then, with the drive of the air cylinder 37, the one holder 31a and the other holder 31b are moved in approaching direction relatively to interpose the wafers W carried by the wafer transfer arm 10 between the holders 31a, 31b while holding the wafers W by the holding grooves 32A. At this time, the wafers W are held while leaving a little clearance against the bottom parts of the holding grooves 32A (see FIG. 11A). After holding the wafers W by the posture changing device 30, the wafer transfer arm 10 is withdrawn from the posture changing device 3. Note, the vacant carrier 1 where the wafers W have been picked up is conveyed to the carrier stand-by section 7 above the interface section 4 by a not-shown carrier lifter.

After holding the wafers W in the horizontal condition, the servo-motor 35 is driven to rotate both holders 31a, 31b by an angle of 90 degrees, so that the posture of the wafers W is changed into the vertical arrangement. (see FIG. 9) Then, each wafer W moves in the holding groove 32A and finally reaches the bottom of the groove 32A. (see FIG. 10) Simultaneously, since air is sucked from each groove 32A by the exhaust unit 34 through the exhaust hole 33, it is possible to remove the particles sticking to the holding grooves 32A.

After the wafers W have been brought into the vertical arrangement by the posture changing device 30, the notch aligner 40 is brought below the device 30 and sequentially elevated upward. Then, both of the holders 31a, 32b are expanded while supporting the wafers W on the guide rollers 42, 43 and the drive roller 43, so that the wafers W are delivered from the posture changing device 30 to the notch aligner 40. The notch aligner 40 operates to true up the notches of the wafers W. The wafers W lined up in this way are accepted by the holder 31A, 31B of the posture changing device 30 again. The notch aligner 40, which has delivered the wafers W to the posture changing device 40, retreats to the initial "stand-by" position.

Next, after the pitch changer 20 has been brought below the posture changing device 30, the changer 20 is elevated to hold the plural wafers W in the vertical arrangement by the side-part holding parts 22, 23 and the lower-part holding parts 24, 25, for example the first holding part 21A, i.e. the side-part holding members 22a, 23a and the lower-part holding member 24a, 25a and the pitches among the wafers W are adjusted. (see FIG. 7) After adjusting the pitches on receipt of the wafers W, the pitch changer 20 is elevated on the "stand-by" side to deliver the wafers W to the wafer transfer chuck 51 waiting upward. In the delivery, after the lower-part holding arm 51b of the wafer transfer chuck 51 enters between the lower-part holding parts 24, 25 of the raised pitch changer 20, the pitch changer 20 is lowered and simultaneously, the wafers W are held by the side-part holding arms 51c on both sides of the arm 51b.

Note, after completing to deliver the wafers W to the pitch changer 20, both holders 31a, 31b are rotated by the servo-motor 35, from the initial position by an angle of 180 degrees. Consequently, the holding grooves 32B occupy a low position, while the holding grooves 32A in which the unprocessed wafers W have been held occupy a high position.

The wafer transfer chuck 51 on receipt of the wafers W firstly transports them to the first processing unit 52. The wafers W brought into the first processing unit 52 are cleaned by the cleaning liquid such as the pure water, after the particles and organic contaminants have been removed by the chemicals, for example an APM solution (a mixture of ammonia, hydrogen peroxide water and pure water). Next, the wafers W after the first-stage cleaning are delivered to the wafer transfer chuck 51 again and conveyed to the second processing unit 53. In the unit 53, the wafers W are cleaned by the pure water after the metal contaminants have been removed by the chemicals, for example a HPM solution (a mixture of hydrochloric acid, hydrogen peroxide water and pure water). Next, the wafers W cleaned in this way are delivered to the wafer transfer chuck 51 again and conveyed to the cleaning and drying unit 54. In the unit 54, after removing chemical oxide layers on the wafers W by hydrogen fluoride acid, the wafers W are dried by dry steam, for example IPA (isopropyl alcohol) gas.

The dried wafers W are delivered to the pitch changer 20 by the wafer transfer chuck 51. Then, by the air cylinder 26c, the pitch changer 20 is elevated to hold the wafers W under condition that the second holding part 21B, i.e. the side-part holding members 22b, 23b and the lower-part holding members 24b, 25b are raised. Simultaneously, the side-part holding arms 51c of the wafer transfer chuck 51 are expanded to deliver the wafers to the pitch changer 20. In this way, since the wafers W are held by the second holding part 21B (i.e. the side-part holding members 22b, 23b and the lower-part holding members 24b, 25b) which is different from the first holding part 21A (i.e. the side-part holding members 22a, 23a and the lower-part holding members 24a, 25a) to deal with the unprocessed wafers W, it is possible to prevent the processed wafers W from being contaminated by the particles etc. sticking to the previously holding portion.

In sequence, the pitch changer 20 on receipt of the wafers W from the wafer transfer chuck 51 firstly descends, next moves the underside of the posture changing device 30 and rises to allows the wafers W to enter between the expanded holders 31a, 31b. Then, the air cylinder 37 drives the one holder 31a and the other holder 31b to move in an approaching direction relatively while interposing the wafers therebetween, so that the wafers W are held by the holding grooves 32B different from the holding grooves 32A dealing with the unprocessed wafers W (see FIG. 15A). Thus, there is no possibility that the particles etc. sticking to the holding grooves 32A carrying the unprocessed wafers W stick to the processed wafers W. After the wafers W have been held by he posture changing device 30, the pitch changer 20 retreats apart from the posture changing device 30.

On receipt of the wafers W from the pitch changer 20, the servo-motor 35 is driven to rotate the holders 31a, 31b by an angle of 90 degrees. Consequently, the posture of the wafers W is changed from the vertical arrangement to the horizontal arrangement. (see FIG. 5) In this state, the other water transfer arm 10, namely, the arm body 12 different from the arm body 11 carrying the unprocessed wafers W moves toward the posture changing device 30 and enters between the horizontal wafers W to carry them. On confirmation that the wafers W are carried by the arm body 12, the air cylinder 37 is activated to open both holders 31a, 31b, so that the wafers W are delivered to the arm body 12 of the wafer transfer arm 10. Note, at this time, the arm body 12 for accepting the wafers W is moved toward the holders 31a, 31b by a feed distance larger than that of the arm body 11.

After receiving the wafers W, the wafer transfer arm 10 is moved to the wafer delivery section 6 to accommodate the wafers W in the vacant carrier 1 waiting at the wafer delivery section 6. Thereafter, the lid body 1c of the carrier 1 is closed by the lid closing unit 8 and the carrier 1 is transferred from the wafer delivery section 6 to the carrier output part 5b.

Note, in the processing section 3, since the wafer transfer chuck 51 transferring the processed wafers W to the cleaning and drying unit 54 is subjected to the chemicals, the cleaning liquid etc., the chuck 51 is conveyed into a chuck cleaning unit 55 before next receiving the unprocessed or processed wafers W. Thus, the arms 51b, 51c of the wafer transfer chuck 51 are cleaned and sequentially dried for the next transportation of the wafers W.

Note, if providing some filtering units with fans, such as HEPA filters, ULPA filters etc. on the loading and unloading section 2, the processing section 3 and the interface section 4, then the apparatus having higher cleaning capability would be provided although it is not shown in the figures.

In the above-mentioned embodiment, 25 pieces of wafers W accommodated in the carrier 1 are collectively picked up for the posture changing, notch aligning and pitch adjusting processes in sequence and thereafter, the wafers W are subjected to the cleaning process. Now, we describe a case that the wafers W are divided into some batches of the predetermined number of wafers for transportation, with reference to FIGS. 17 to 20.

Figures 17A, 17B:
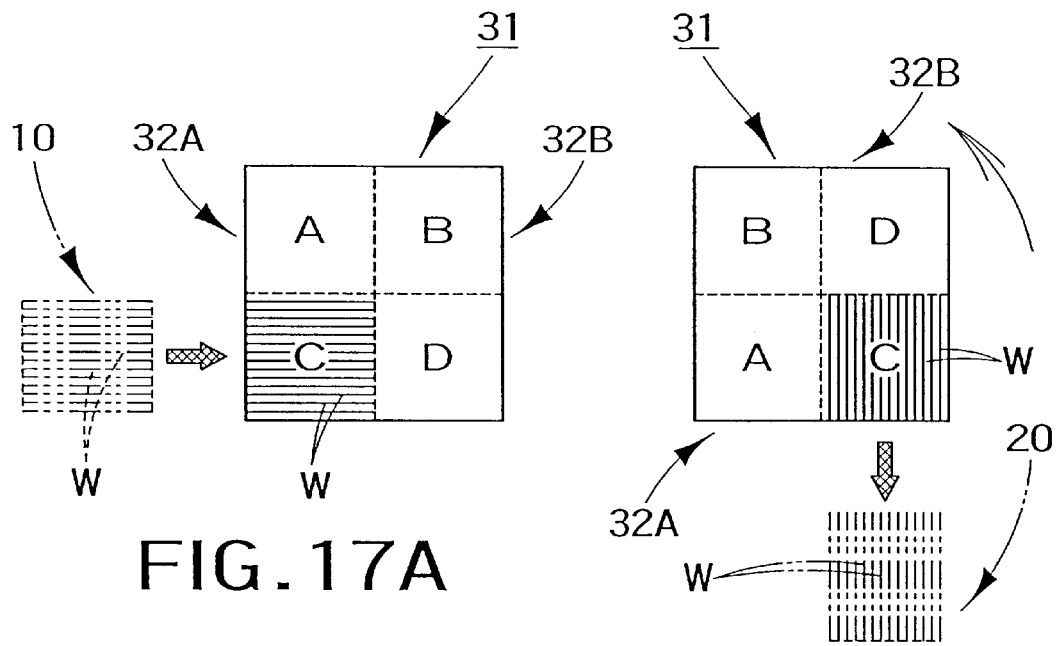
FIG. 17A is a schematic structural view showing a condition that the unprocessed wafers are delivered from a wafer transfer arm to a wafer holder.
FIG. 17B is a schematic structural view showing a condition that the unprocessed wafers are delivered from the wafer holder to the pitch-changer.
Figures 18A, 18B:
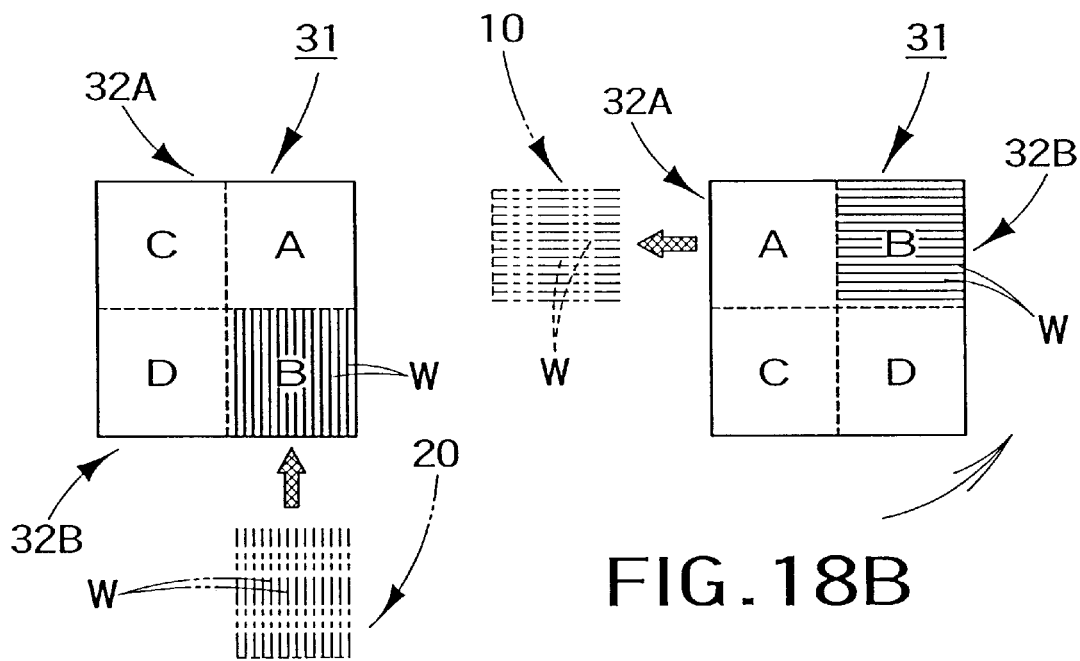
FIG. 18A is a schematic structural view showing a condition that the processed wafers are delivered from the pitch-changer to the wafer holder.
FIG. 18B is a schematic structural view showing a condition that the processed wafers are delivered from the wafer holder to the wafer transfer arm.
Figure 19A:
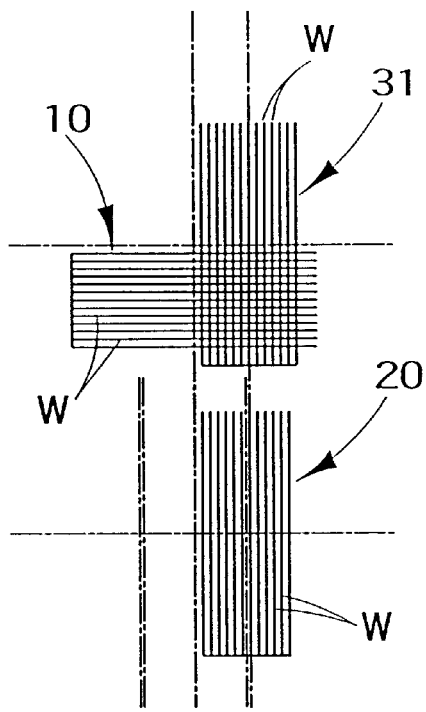
FIGS. 19A, 19B, 19C and 19D are explanation diagrams showing steps of transporting thirteen wafers to the pitch-changer in due order.
Figure 19B:
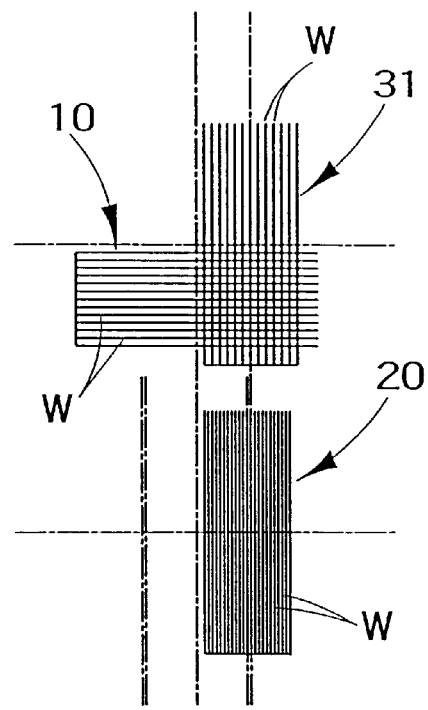
Figure 19D:
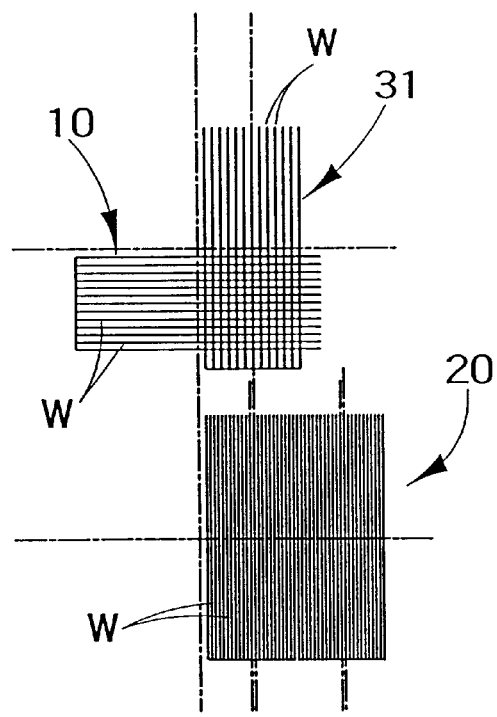
Figure 19C:
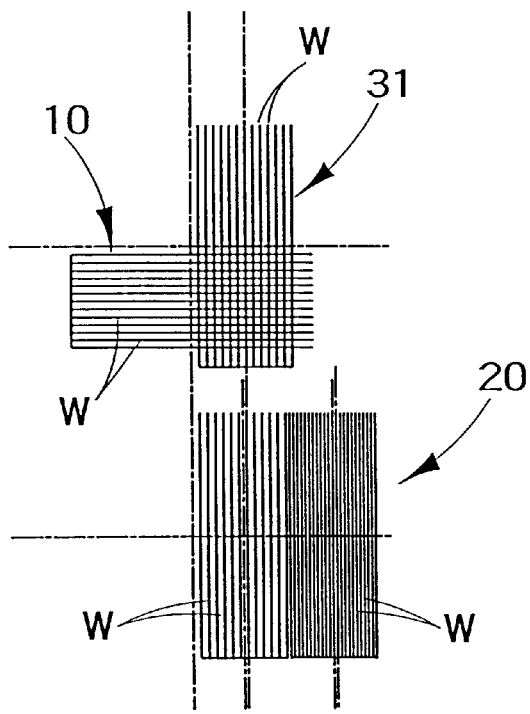
Figure 20A:
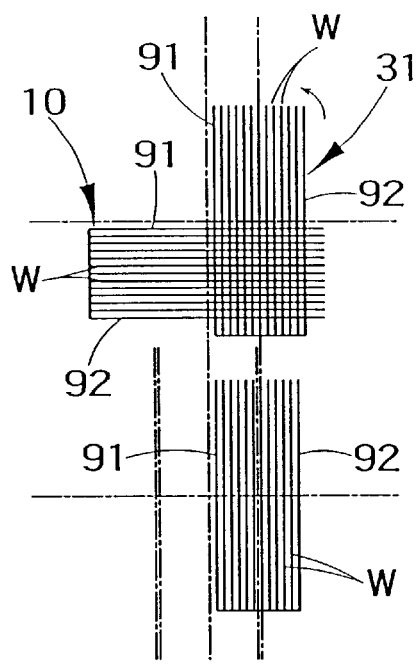
FIGS. 20A, 20B, 20C and 20D are explanation diagrams showing successive steps of transporting thirteen wafers to the pitch-changer while opposing their mirror finished surfaces to each other.
Figure 20B:
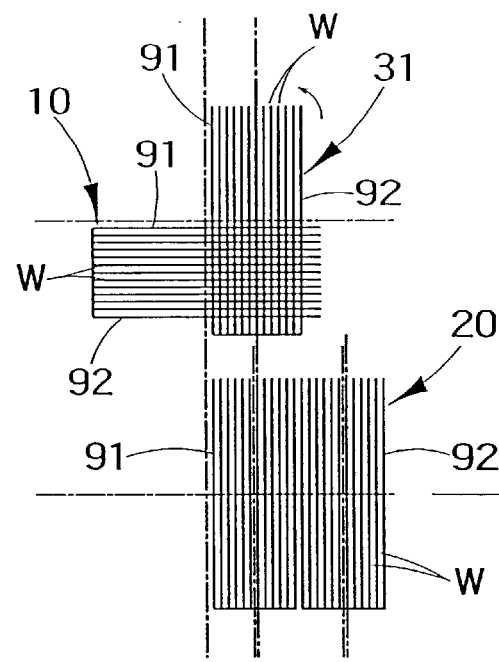
Figure 20D:
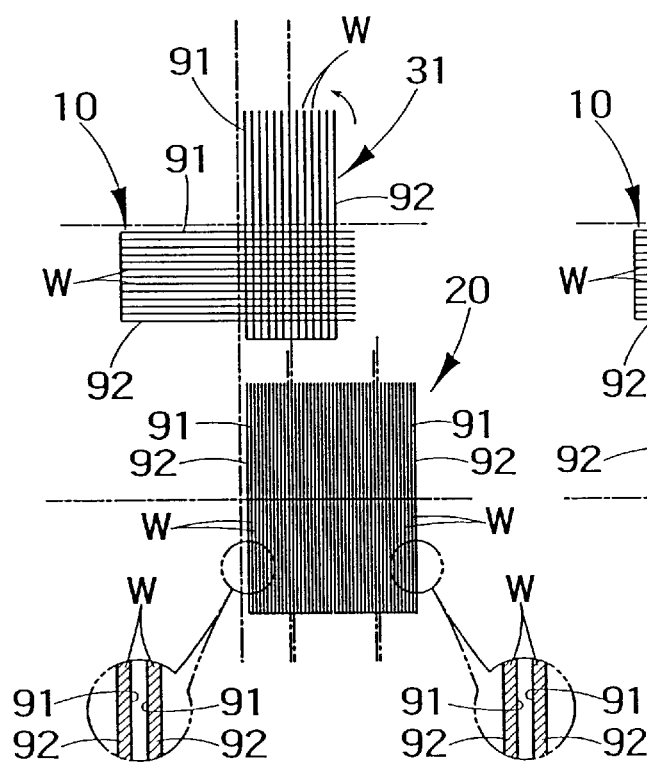
Figure 20C:
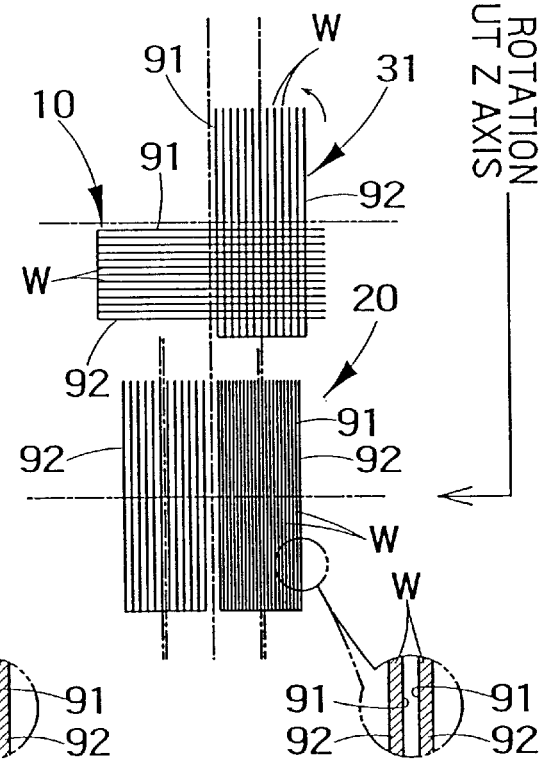

In the figures, FIG. 17A shows a condition to deliver the unprocessed wafers W from the wafer transfer arm 10 to the posture changing device 30 and FIG. 17B also shows a condition to deliver the unprocessed wafers W from the posture changing device 30 to the pitch changer 20. Similarly, FIG. 18A shows a condition to deliver the processed wafers W from the pitch changer 20 to the posture changing device 30 and FIG. 18B also shows a condition to deliver the processed wafers W from the posture changing device 30 to the wafer transfer arm 10. Note, the holders 31a, 31b are representative of the posture changing device 30. In these holders 31a, 31b which will be indicated with reference numeral 31 hereinafter, the holding grooves 32A for holding the unprocessed wafers W and the holding grooves 32B for holding the processed wafers W are divided into two areas A, C and two area B, D, respectively. Note, each of the areas A, B, C and D is provided with thirteen holding grooves.

Next, we describe a detailed example of transporting 13 pcs. of wafers W

The transporting method is as follows:

① First of all, on receipt of the horizontal wafers W by the posture changing device 30 (in detail, in the area C of the holder 31) after holding 13 pieces of wafers W by the wafer transfer arm 10 (in detail, the arm body 11) horizontally, the posture of the wafers W is changed to the vertical arrangement by rotating the holder 31 by an angle of 90 degrees. Thereafter, the notches of the wafers W are aligned by the notch aligner 40 and successively, the wafers W are held vertically by the holder 31 again. While keeping such a condition, then the wafers W are retained by the alternate holding grooves of the holding part on the base side of the pitch changer 20, for example the every other holding grooves of the first holding part 21A, at intervals of e.g. 10 mm in each pitch. (see FIG. 19A).

② Next, the next-coming 13 pcs. of wafers W are delivered from the wafer transfer arm 10 to the horizontal area C on the holder 31. As similar to the abovementioned step, the posture of the wafers W is changed to the vertical arrangement and successively the notches of the wafers W are aligned by the notch aligner 40. Next, the pitch changer 20 is shifted by 5 mm in order to align 13 vacant grooves which have not been ocuppied by the wafers with 13 pcs. of the wafers W on the holder 31. Keeping this condition, the pitch changer 20 is elevated to receive the next-coming wafers (13 pcs.) W from the holder 31 to the grooves of the holding part on the base side of the pitch changer 20, so that the wafers (26 pcs. in total) W are arranged at intervals of e.g. 5 mm in each pitch on the base side of the first holding part 21A. (see FIG. 19B)

③ Next, the further next-coming 13 pcs. of wafers W are delivered from the wafer transfer arm 10 to the horizontal area C on the holder 31. As similar to the above-mentioned step, after changing the posture into the vertical arrangement and sequentially completing to align the notches, the holding grooves on the side of the leading end of the first holding part 21A of the pitch changer 20 are raised, so that 13 pieces of wafers W are retained by the alternate holding grooves at intervals of e.g. 10 mm in each pitch (see FIG. 19C) on the side of the leading end of the first holding part 21A.

④ Next, the next-corning 13 pcs. of wafers W are delivered from the wafer transfer arm 10 to the horizontal area C on the holder 31. As similar to the abovementioned step, the posture of the wafers W is changed to the vertical arrangement and successively the notches of the wafers W are aligned by the notch aligner 40. Next, the pitch changer 20 is shifted by 5 mm in order to align 13 vacant grooves on the leading side which have not been ocuppied by the wafers with 13 pcs. of the wafers W on the holder 31. Keeping this condition, the pitch changer 20 is elevated to receive the next-coming wafers (13 pcs.) W from the holder 31, so that the wafers (52 pcs. in total) W are arranged at intervals of e.g. 5 mm in each pitch. (see FIG. 19B).

Next, the wafers (52 pcs.) W after the pitch-adjustment are received by the wafer transfer chuck 51 and transported to the processing units 52–54 in the processing section 3 for respective proper treatments. Note, the holding arms 51b, 51c of the wafer transfer chuck 51 are provided, with notches (not shown) which allow the wafers W to pass therethrough when the wafers W have been already held in the groove pitches (pitch of 10 mm) of the pitch changer 20.

The processed wafers (52 pcs.) W are successively conveyed into the carrier 1 in a batch of 13 pcs. of wafers W, in reverse order. The difference between the process before the cleaning mentioned above and the process after the cleaning resides in that, during the above transportation, the processed wafers W are held by the second holding part 21B of the pitch changer 20 and also held by the holding grooves of the holder 31 in another area B in a diagonal relationship with the area C for retaining the unprocessed wafers W. In detail, owing to the drive of the air cylinder 6c, the second holding part 21B (i.e. the side-part supporting members 22b, 23b and the lower-part supporting members 24b, 25b) is elevated to accept the wafers W from the wafer transfer chuck 51. Further, as shown in FIG. 18A, the holder 31 receives the processed wafers (13 pcs.) W from the pitch changer 20 while allowing the area B to standing ready vertically. Then, as shown in FIG. 18B, the holder 31 is rotated by an angle of 90 degrees thereby to change the posture of the wafers W to the horizontal arrangement and thereafter, the wafers W are delivered to the wafer transfer arm 10 (in detail, the arm body 12) for accommodating them in the carrier 1. At this time, the arm body 12 for accepting the wafers W is moved toward the holder 31 by a feed distance larger than that of the arm body 11. After the wafers W have been delivered to the wafer transfer arm 10, the holder 30 is again rotated by an angle of 90 degrees, in order to allow the area B to vertically stand ready for the next-coming acceptance. Thereafter, by repeating the same operations as mentioned above, 52 pcs. of processed wafers W are successively accommodated in the carrier 1, whereby a series of processes can be completed.

As mentioned above, according to the embodiment, the apparatus is adapted in a manner that, after the pitch changer 20 has held 26 pcs. of wafers W on the base side, the changer 20 holds the remaining 26 pcs. of remaining wafers W on the leading side. Consequently, it is possible to reduce the moving distance of the pitch changer 20 and realize the rapid delivery of the wafers. In addition, by retaining the unprocessed and processed wafers W and changing the posture by the area C and the area B both on the diagonal line of the holder 31, it is possible to prevent the processed wafers W from being contaminated by the particles or the like sticking on the area C because the area C and the area B do not overlap each other. Exactly, when accepting the processed wafers W by the area B of the holder 31, then the area C retaining the unprocessed wafers W is positioned on the diagonal line. Therefore, there is no possibility that the particles sticking on the area C fall on the area B, whereby it is possible to change the posture of the processed wafers W while carrying them safely. Moreover, owing to the holding of the unprocessed wafers W by the first holding part 21A of the pitch changer 20 and the holding of the processed wafers W by the second holding part 21B of the pitch changer 20, it is possible to prevent the processed wafers W from being contaminated by the particles etc. sticking to the first holding part 21A.

Next, we describe the transporting form for 13 pcs. of wafers W in case of processing the wafers W while opposing their polished faces each other. It should be noted that, in the horizontal arrangement, the wafers W are generally held so that respective polished faces thereof direct upward.

① First of all, on receipt of the horizontal wafers W by the posture changing device 30 (in detail, in the area C of the holder 31) after holding 13 pieces of wafers W by the wafer transfer arm 10 (in detail, the arm body 11) horizontally, the posture of the wafers W is changed to the vertical arrangement by rotating the holder 31 by an angle of 90 degrees. Thereafter, the notches of the wafers W are aligned by the notch aligner 40 and sequentially, the wafers W are held vertically by the holder 31 again. Next, the wafers W are retained by the alternate holding grooves on the base side of the first holding part 21A of the pitch changer 20, at intervals of e.g. 10 mm in each pitch. (see FIG. 20A) Note, in the horizontal arrangement of the wafers W, each polished surface 91 directs upward, while each back surface 92 directs downward. In the vertical arrangement of the wafers W, each polished surface 91 directs to the left-hand side in the figure, while each back surface 92 directs to the right-hand side.

② Next, the next-coming 13 pcs. of wafers W is delivered from the wafer transfer arm 10 to the horizontal area C of the holder 31. After changing to the vertical arrangement and sequentially completing to align the notches of the wafers W, the holding grooves on the leading side of the first holding part 21A is arranged directly under the next-coming 13 pcs. of the wafers on the holder 31 by the movement of the pitch changer 20 and sequentially elevated. Next, the next-coming wafers (13 pcs.) W delivered from the holder 31 are accepted by the alternate holding grooves on the leading side of the first holding part 21A. Finally, the wafers (26 pcs. in total) W are arranged at intervals of e.g. 10 mm in each pitch on the first holding part 21A (see FIG. 20B).

③ Next, the horizontal area C of the holder 31 receives the next-coming 13 pcs. of wafers W from the wafer transfer arm 10. After changing to the vertical arrangement, the notch-adjusting for the wafers W is carried out. Then, the pitch changer 20 is rotated from the initial position by an angle of 180 degrees in order to turn the direction in which the polished surfaces of the wafers on the pitch changer 20 face in a direction opposite to the direction in which polished surfaces of the wafers on the holder 31 face, and is sifted so as to align the vacant grooves on the base side which have not been occupied by the wafers with the next-coming 13 pcs. of wafers on the holder 31. After that the pitch changer 20 is elevated to hold 13 pcs. of wafers W (39 pcs. in total) by the holding grooves on the base side of the first holding part 21A at pitches of e.g. 5 mm, while opposing the polished surfaces of the wafers W each other. (see FIG. 20C)

④ Next, the horizontal area C of the holder 31 receives the next-coming 13 pcs. of wafers W from the wafer transfer arm 10. After changing to the vertical arrangement, the notch-adjusting for the wafers W is carried out. Thereafter, the pitch changer 20 is moved so as to align the vacant grooves on the leading side which have not been occupied by the wafers with the next-coming 13 pcs. of wafers on the holder 31. Then, the pitch changer 20 is elevated to receive 13 pcs. of wafers W from the holder 31, thereby adjusting the pitch of the wafers W (52 pcs. in total) to be of 5 mm, while opposing the polished surfaces 91 of the wafers W each other (see FIG. 20D). In this way, it is completed to adjust the pitches of the wafers W and oppose the polished surfaces 91 each other.

Next, the wafers (52 pcs.) W after the pitch-adjustment and the oppose-arrangement are received by the wafer transfer chuck 51 thereby to transport the processing units 52–54 in the processing section 3 for respective proper treatments.

The processed wafers (52 pcs.) W are successively conveyed into the carrier 1 in a batch of 13 pcs. of wafers W, in reverse order. The difference between the process before cleaning and the process after cleaning resides in that, during the above transportation, the processed wafers W are held by the second holding part 21B of the pitch changer 20 and also held by the holding grooves of the holder 31 in another area B in the diagonal relationship with the area C for retaining the unprocessed wafers W, as similarly to the above-mentioned transporting form of 13 pcs. of wafers W. In detail, owing to the drive of the air cylinder 6c, the second holding part 21B (i.e. the side-part supporting members 22b, 23b and the lower-part supporting members 24b, 25b) is elevated to accept the wafers W from the wafer transfer chuck 51. Further, as shown in FIG. 18A, the holder 31 receives the processed wafers (13 pcs.) W on the leading side of the pitch changer 20 while allowing the area B to standing ready vertically. Thereafter, as shown in FIG. 18B, the holder 31 is rotated by an angle of 90 degrees, so that the posture of the wafers W is changed into the horizontal arrangement where the polished surfaces 91 direct upward. After that, the wafers W are delivered to the wafer transfer arm 10 (in detail, the arm body 12) in order to accommodate them in the carrier 1. After delivering the wafers W to the wafer transfer arm 10, the holder 31 is again rotated by an angle of 90 degrees, in order to allow the area B to vertically stand ready for the next-coming acceptance. Next, on receipt of the processed wafers (13 pcs.) W on the base side of the pitch changer 20, the holder 31 is rotated by an angle of 90 degrees so that the polished surfaces 91 of the wafers W direct upward.

Next, the holder 31 is again rotated by an angle of 90 degrees, in order to allow the area B to vertically stand ready for the next-coming acceptance, while the pitch changer 20 is rotated to position the wafers (13 pcs.) W on the leading side, by an angle of 180 degrees and elevated to deliver the remaining processed wafers (13 pcs.) W on the leading side of the pitch changer 20 to the holder 31. Thereafter, the holder 31 is again rotated by an angle of 90 degrees to deliver the wafers W in the horizontal arrangement where the polished surfaces 91 direct upward to the wafer transfer arm 10. Next, the holder 31 is again rotated by an angle of 90 degrees, in order to allow the vertical area B to stand ready for the next-coming wafers W. Then, on receipt of the remaining processed wafers (13 pcs.) W on the base side of the pitch changer 20, the holder 31 is rotated by an angle of 90 degrees. Consequently, the wafers W are brought into the horizontal condition where the polished surfaces 91 direct upward and sequentially delivered to the wafer transfer arm 10. Then, the processed wafers (52 pcs.) W are accommodated in the vacant carrier 1 and then the transporting process is completed.

Note, although the unprocessed wafers W are held by the first holding part 21A of the pitch changer 20 while the processed wafers W are held by the second holding part 21B in the above-mentioned embodiment, the opposite is also applicable to the modification. That is, in the modification, the unprocessed wafers W may be held by the second holding part 21B of the pitch changer 20 while holding the processed wafers W by the first holding part 21A. Further, although the second holding part 21B, i.e., the side-part holding members 22b, 23b and the lower-part holding members 24b, 25b are mounted on the movable table 26b for elevation, both first holding part 21A and second holding part 21B may be adapted so as to rise and fall for their relative elevation.

In the modification of the arrangement where the posture changing device 30 is provided, on opposing sides of the holders 31a, 31b, with the holding grooves 32A, 32B, they may be formed on one side and the adjoining side of each holder 31a, 31b, perpendicularly to each other.

Figure 21:
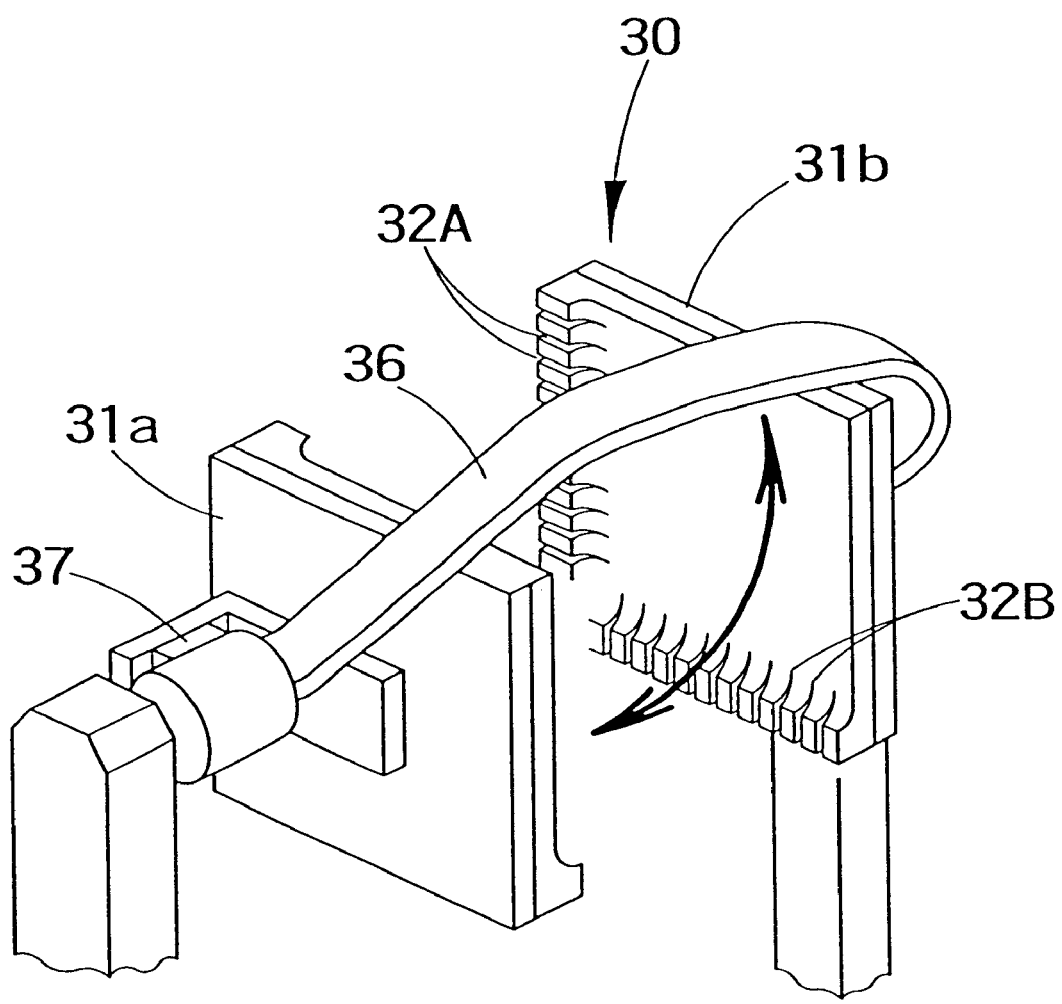
FIG. 21 is a perspective view showing another posture changing device in a modification of the invention.

In detail, as shown in FIG. 21, the holding grooves 32A may be formed on each side (left side in the figure) of the pair of generally rectangular-shaped holders 31a, 31b, while the holding grooves 32B are formed on the adjoining side (right lower side in the figure) of the pair of generally rectangular-shaped holders 31a, 31b. With the arrangement, the holding grooves 32A, 32B are respectively formed on the side and the adjoining side of each holder 31a, 31b, perpendicularly to each other. Note, as to the shown posture changing device 30 of FIG. 21, we eliminate the descriptions of other elements which are similar to those in the above-mentioned embodiment.

Figure 22A:
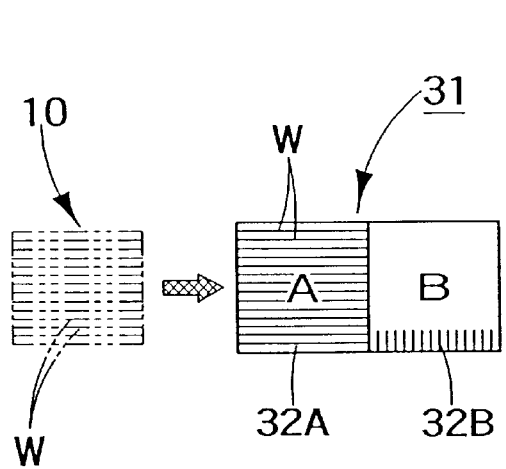
FIG. 22A is a schematic structural view showing a condition that the unprocessed wafers are delivered from a wafer transfer arm to a wafer holder.
Figure 22B:
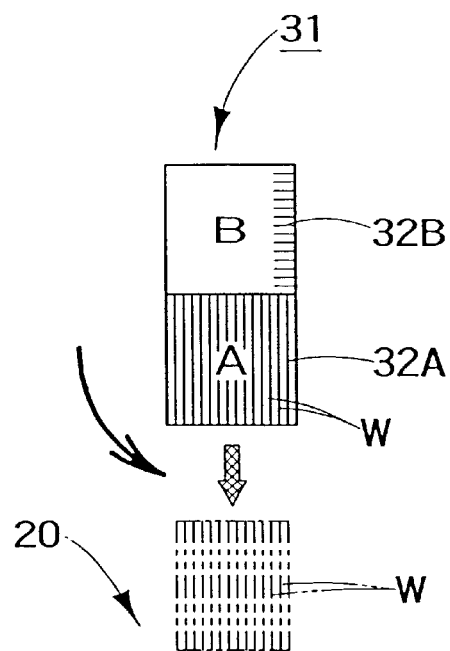
FIG. 22B is a schematic structural view showing a condition that the unprocessed wafers are delivered from the wafer holder to a pitch-changer.

Next, we describe the steps of transporting the wafers W by using the so-constructed posture changing device 30, with reference to FIGS. 22 and 23. Note, the holders are indicated with reference numeral 31, representatively.

First of all, on condition of horizontally holding the wafers (e.g. 50 pcs.) W by the wafer transfer arm 10 (in detail, the arm body 11), the horizontal wafers W are received by the posture changing device 30, i.e. the holding grooves 32A in the area A of the holder 31. (see FIG. 22A).

Next, the horizontal wafers W are changed into the vertical arrangement by vertically rotating the holder 31 by an angle of 90 degrees. After the notches of the wafers W have been aligned by the notch aligner 40, the wafers W are held vertically by the holder 31 again and sequentially retained by the holding grooves in the holding part of the pitch changer 20. (see FIG. 22B) Then, on receipt of the wafers (e.g. 50 pcs.) W, the wafer transfer chuck does transport them to the processing units 52 to 54 in the processing section 3.

Figure 23A:
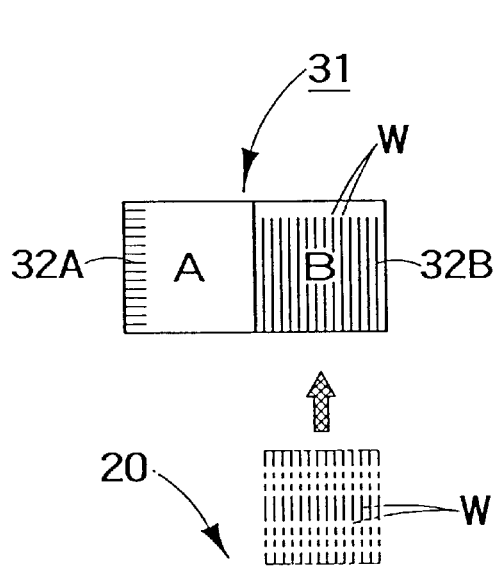
FIG. 23A is a schematic structural view showing a condition that the processed wafers are delivered from the pitch-changer to the wafer holder.
Figure 23B:
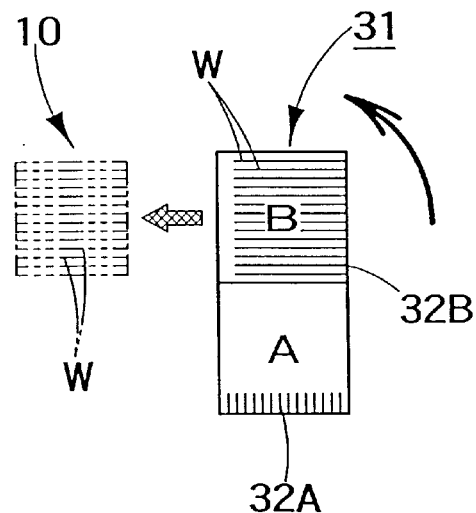
FIG. 23B is a schematic structural view showing a condition that the processed wafers are delivered from the wafer holder to the wafer transfer arm.

The processed wafers (50 pcs.) W are successively conveyed in reverse order. The difference between the process before cleaning and the process after cleaning resides in that, during this transportation, the processed wafers W are held by the holding grooves in the area B different from the area A for retaining the unprocessed wafers W. That is, as shown in FIG. 23A, under condition of maintaining the holding grooves 32B in the area B of the holder 31 vertically, the processed wafer (50 pcs.) W are delivered from the pitch changer 20. Next, as shown in FIG. 23B, the holder 31 is rotated by an angle of 90 degrees thereby to change the posture of the wafers W to the horizontal arrangement and thereafter the wafers W are delivered to the wafer transfer arm 10 (in detail, the arm body 12) for accommodating them in the carrier 1.

As mentioned above, the unprocessed wafers W are dealt with the holding grooves 32A in the area A of the holder 31, while the processed wafers W are dealt with the holding grooves 32B in the area B of the holder 31, which are perpendicular to the holding grooves 32A, respectively. Therefore, there is no possibility that the particles sticking on the area A fall on the area B, whereby it is possible to change the posture of the processed wafers W while carrying them safely.

Although the substrate transporting apparatus of the present invention is applied on the cleaning system for semiconductor wafers in the above-mentioned embodiment, of course, the invention is also applicable to the system for process besides the cleaning process. Further, it is a matter of course that the present apparatus is also applicable for glass substrates for LCD except for the semiconductor wafers.

As mentioned above, according to the substrate transporting apparatus of the invention, it is possible to change respective charges for holding the unprocessed and processed substrates between the first holding part and the second holding part. In addition, since the holding condition due to the first holding part can be substantially identical to the holding condition due to the second holding part, it is possible to carry a plurality of substrates at predetermined intervals in the stable condition. Accordingly, the apparatus can be small-sized thereby to improve both throughput and product yield.

Additionally, since the plural substrates interposed between a pair of holders are also held in different holding grooves by the single posture changing means for changing the posture of the substrates between the horizontal arrangement and the vertical arrangement, it is possible to receive the unprocessed substrates from the horizontal holding means by the holding grooves on one hand, change the posture from the horizontal arrangement to the vertical arrangement and also deliver the vertical substrates to the vertical holding means. Similarly, it is also possible to receive the processed substrates from the vertical holding means by the holding grooves on the other hand, change the posture from the vertical arrangement to the horizontal arrangement and also deliver the horizontal substrates to the horizontal holding means. Therefore, the apparatus can be further small-sized to improve both throughput and product yield, too.

What is claimed is:

1. A substrate transporting apparatus comprising:

a substrate loading and unloading section for loading and unloading a plurality of substrates;

a substrate processing section for applying a designated treatment on said substrates;

a substrate delivery section for delivering said substrates from said substrate loading and unloading section to said substrate processing section and vice versa, said substrate delivery section having substrate holding means for holding said substrates delivered in a row;

substrate transporting means for transporting said substrates between said substrate processing section and said substrate delivery section; and substrate spacing means for vertically holding said substrates at predetermined intervals, said substrate spacing means being positioned between said substrate holding means and said substrate transporting means, wherein said substrate spacing means includes a first holding part for holding said substrates and a second holding part for holding said substrates;

said first holding part has a lower-part supporting member formed with a plurality of holding grooves, said holding grooves respectively engaging with bottom portions of said substrates when holding said substrates vertically, and a side-part supporting member formed with a plurality of holding grooves, said holding grooves respectively engaging with upper side edges on both sides of each of said bottom portions of said substrates when holding said substrates vertically;

said second holding part has a lower-part supporting member formed with a plurality of holding grooves, said holding grooves respectively engaging with bottom portions of said substrates when holding said substrates vertically, and a side-part supporting member formed with a plurality of holding grooves, said holding grooves respectively engaging with upper side edges on both sides of each of said bottom portions of said substrates when holding said substrates vertically; and said first and second holding parts are adapted so as to rise and fall relative to each other, whereby said substrates are held by either one of said first holding part or said second holding part, at predetermined intervals, wherein said holding grooves of said first holding parts and said holding grooves of said second holding parts are formed so as to engage with said substrates at symmetrical positions thereof, wherein said holding grooves of said side-part supporting member in said first and second holding parts are formed so as to have substantial V-shaped cross sections in order to support said substrates, said holding grooves of said lower-part supporting member in said first and second holding parts being formed so as to have substantial Y-shaped cross sections in order to prevent said substrates from inclining.

2. A substrate transporting apparatus as claimed in claim 1, wherein said first holding part and said second holding part are installed in two different holders, respectively and wherein at least either one of said holders is provided with elevating means for elevating said first holding part and said second holding part relative to each other.

3. A substrate transporting apparatus as claimed in claim 1, wherein said first holding part and said second holding part are adapted so as to change respective directions of said first and second holding parts in a horizontal plane.

4. A substrate transporting apparatus as claimed in claim 1, wherein said substrate spacing means is adapted so as to move to both vertical and horizontal directions.

* * * * *